US012622233B2

(12) United States Patent
Nam et al.

(10) Patent No.: US 12,622,233 B2
(45) Date of Patent: May 5, 2026

(54) METHOD OF FABRICATING SEMICONDUCTOR DEVICE

(71) Applicant: Samsung Electronics Co., Ltd., Suwon-si (KR)

(72) Inventors: Seowoo Nam, Suwon-si (KR); Kyungsoo Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 359 days.

(21) Appl. No.: 18/366,470

(22) Filed: Aug. 7, 2023

(65) Prior Publication Data

US 2024/0063018 A1 Feb. 22, 2024

(30) Foreign Application Priority Data

Aug. 19, 2022 (KR) ........................ 10-2022-0104121

(51) Int. Cl.
H10P 76/40 (2026.01)
H10P 50/00 (2026.01)
H10W 20/00 (2026.01)

(52) U.S. Cl.
CPC .......... H10P 76/4085 (2026.01); H10P 50/73 (2026.01); H10W 20/056 (2026.01); H10W 20/081 (2026.01)

(58) Field of Classification Search
CPC ............. H01L 21/0337; H01L 21/0332; H01L 21/31144; H01L 21/76802; H01L 21/76816; H01L 21/768; H01L 21/76877; H01L 21/76879; H10P 76/4085; H10P 50/73; H10W 20/056; H10W 20/081
See application file for complete search history.

(56) References Cited

U.S. PATENT DOCUMENTS

| 9,123,656 B1* | 9/2015 | Hsieh .................. H01L 21/3086 |
| 9,768,025 B2* | 9/2017 | Siew .................. H01L 21/0337 |
| 10,249,496 B2* | 4/2019 | Shu .................. H01L 21/0337 |
| 10,366,917 B2* | 7/2019 | Zhu .................. H01L 21/76816 |
| 10,446,395 B1* | 10/2019 | Shu .................. H01L 23/5226 |
| 10,643,845 B2 | 5/2020 | Zhang et al. |
| 10,755,969 B2 | 8/2020 | Chu et al. |
| 10,770,291 B2 | 9/2020 | Schenker et al. |
| 11,145,668 B2 | 10/2021 | Reznicek et al. |
| 11,239,236 B2 | 2/2022 | Lilak et al. |
| 11,264,271 B2 | 3/2022 | O'Toole et al. |

(Continued)

*Primary Examiner* — Bac H Au
(74) *Attorney, Agent, or Firm* — Harness, Dickey & Pierce, P.L.C.

(57) ABSTRACT

A method of fabricating a semiconductor device, includes forming a dielectric layer on a substrate; forming a hard mask layer on the dielectric layer; forming mandrel lines on the hard mask layer, each of the mandrel lines extending in a first direction; forming spacers on both sidewalls of each of mandrel lines; removing the plurality of mandrel lines from the spacers; forming a first linear opening corresponding to a first region of a space between adjacent ones of the spacers, in the hard mask layer; forming a second linear opening corresponding to a second region of the space between the adjacent ones, the second linear opening being adjacent to the first linear opening in the first direction; forming trenches in the dielectric layer using the hard mask layer; and interconnection lines by filling the trenches with a conductive material.

20 Claims, 25 Drawing Sheets

(56)          References Cited

U.S. PATENT DOCUMENTS

| | | | | |
|---|---|---|---|---|
| 11,315,923 | B2 | 4/2022 | Reznicek et al. | |
| 2016/0035571 | A1* | 2/2016 | Chang ............... | H01L 21/02282 |
| | | | | 438/703 |
| 2017/0025519 | A1* | 1/2017 | Liao .................... | H01L 21/3086 |
| 2017/0200641 | A1* | 7/2017 | Tsai .................. | H01L 21/32133 |
| 2017/0352584 | A1* | 12/2017 | Yaegashi ........... | H01L 21/76807 |
| 2018/0145145 | A1* | 5/2018 | Chen ................... | H01L 21/0337 |
| 2018/0240699 | A1* | 8/2018 | Chan ................... | H10D 62/115 |
| 2018/0261457 | A1* | 9/2018 | Law .................... | H01L 21/0337 |
| 2019/0206725 | A1* | 7/2019 | Chu .................. | H01L 21/76897 |
| 2021/0090997 | A1* | 3/2021 | Haran .............. | H01L 21/76802 |
| 2022/0102143 | A1* | 3/2022 | Chen ................ | H01L 21/76877 |
| 2023/0178379 | A1* | 6/2023 | Ho .................... | H01L 21/02263 |
| | | | | 438/211 |

* cited by examiner

METHOD OF FABRICATING SEMICONDUCTOR DEVICE

CROSS-REFERENCE TO RELATED APPLICATIONS

This application claims benefit of priority to Korean Patent Application No. 10-2022-0104121 filed on Aug. 19, 2022 in the Korean Intellectual Property Office, the disclosure of which is incorporated herein by reference in its entirety.

BACKGROUND

Various example embodiments relate to a method of fabricating a semiconductor device.

Various types of self-aligned patterning such as double or quadruple patterning have been extensively developed/researched as a method of realizing a high resolution of a fine pattern in a semiconductor process. A self-aligned patterning process may be used, for example, in an interconnection line process such as a back-end-of-line (BEOL) and a fine pattern forming process.

According to a recent demand for spacing reduction, defects in the conventional cut-off process introduced for line separation in the self-aligned patterning process may occur, which may cause an undesirable short circuit between interconnection lines in subsequent processes.

SUMMARY

Various example embodiments provide a method of fabricating a semiconductor device by reducing an interval between metal patterns.

According to some example embodiments, a method of fabricating a semiconductor device includes forming a hard mask layer on a target layer; forming a plurality of mandrel lines on the hard mask layer, wherein the plurality of mandrel lines extend in a first direction, and are arranged in a second direction that intersects the first direction; forming spacers on both sidewalls of the plurality of mandrel lines; removing the plurality of mandrel lines from the spacers, wherein the spacers are arranged at intervals defined by a design width of a target pattern; forming a first photomask, having a first opening, on the hard mask layer in which the spacers are formed, wherein the first opening exposes a first linear space defined as a first region of a first space between adjacent ones of the spacers; forming a first linear opening corresponding to the first linear space in the hard mask layer by etching the hard mask layer using the first photomask; forming a second photomask having a second opening on the hard mask layer in which the spacers are formed, after removing the first photomask, wherein the second opening exposes a second linear space defined as a second region of the first space between the adjacent ones of the spacers; forming a second linear opening corresponding to the second linear space in the hard mask layer by etching the hard mask layer using the second photomask; and etching the target layer using the hard mask layer, after removing the second photomask.

According to various example embodiments, a method of fabricating a semiconductor device includes forming a dielectric layer on a substrate; forming a hard mask layer on the dielectric layer; forming a plurality of mandrel lines on the hard mask layer, wherein the plurality of mandrel lines extend in a first direction, respectively, and are arranged in a second direction, intersecting the first direction; forming spacers on both sidewalls of the plurality of mandrel lines; removing the plurality of mandrel lines from the spacers, wherein the spacers are arranged at intervals defined by a design width of a target pattern; forming a first linear opening corresponding to a first region of a space between adjacent ones of the spacers, in the hard mask layer using a first photomask; forming a second linear opening corresponding to a second region of the space between the adjacent ones of the spacers in the hard mask layer using a second photomask, wherein the second linear opening is adjacent to the first linear opening in the first direction; forming first and second trenches respectively corresponding to the first and second linear openings in the dielectric layer using the hard mask layer; and forming a plurality of interconnection lines by filling the first and second trenches with a conductive material.

According to some example embodiments, a method of fabricating a semiconductor device includes forming a dielectric layer on a substrate; forming a hard mask layer on the dielectric layer; forming a plurality of mandrel lines and at least one mandrel pattern on the hard mask layer, wherein the plurality of mandrel lines extend in a first direction, respectively, and are arranged in a second direction, intersecting the first direction, wherein the at least one mandrel pattern has a width, greater than a width of each of the plurality of mandrel lines; forming first spacers and a second spacer on both sidewalls of the plurality of mandrel lines and sidewalls surrounding the at least one mandrel pattern, respectively; removing the plurality of mandrel lines and the at least one mandrel pattern from the first spacers and the second spacer, wherein a distance between the first spacers defines a design width of a target pattern; forming a first linear opening corresponding to a first region of a first space between adjacent ones of the first spacers in the hard mask layer using a first photomask; forming a second linear opening corresponding to a second region of a first space between the adjacent ones of the first spacers in the hard mask layer using a second photomask, wherein the second linear opening is adjacent to the first linear opening in the first direction; forming a wide opening corresponding to a second space surrounded by the second spacer in the hard mask layer; forming first and second trenches respectively corresponding to the first and second linear openings and the wide opening in the dielectric layer using the hard mask layer; and forming a plurality of interconnection lines by filling the first and second trenches with a conductive material.

BRIEF DESCRIPTION OF DRAWINGS

The above and other aspects, features, and advantages of example embodiments will be more clearly understood from the following detailed description, taken in conjunction with the accompanying drawings, in which.

DETAILED DESCRIPTION

Hereinafter, various example embodiments will be described in detail with reference to the accompanying drawings.

Figure 1:
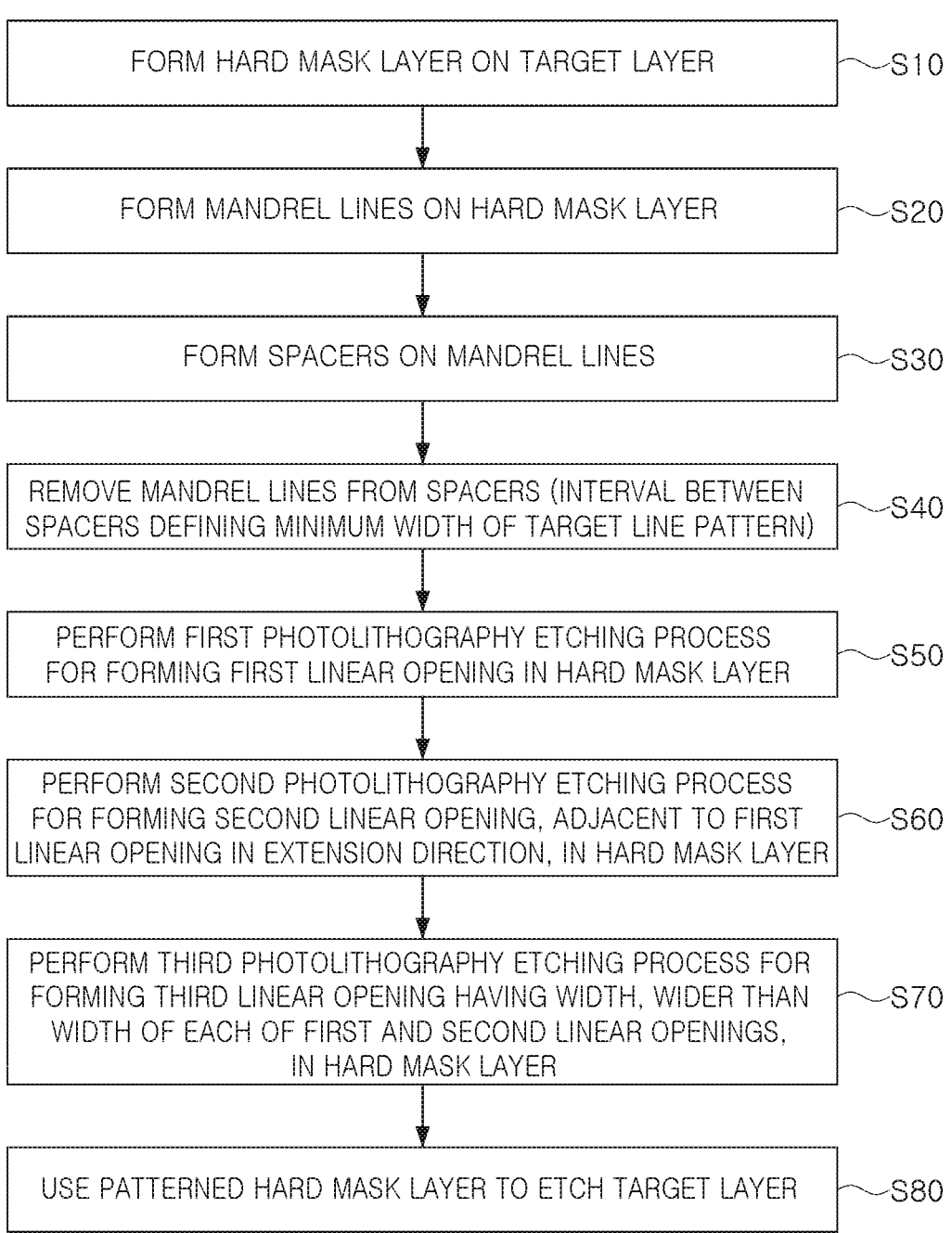
FIG. 1 is a flowchart illustrating a method of fabricating a semiconductor device according to various example embodiments.

FIG. 1 is a flowchart illustrating a method of fabricating a semiconductor device according to various example embodiments. A method of fabricating a semiconductor device according to some example embodiments will be briefly described with reference to FIG. 1.

In S10, a hard mask layer may be formed on a target layer (e.g., on a dielectric layer). The target layer may be or may include an etched layer (e.g., a dielectric layer and/or a semiconductor layer) on which a fine pattern is formed. For example, the target layer may include a dielectric layer to form an interconnection line such as a back-end-of-line (BEOL) interconnect line. The hard mask layer may have a pattern, such as a target or desired pattern, formed by a subsequent self-aligned patterning process. For example, the hard mask layer may include a first hard mask layer and a second hard mask layer that are sequentially stacked on the target layer. The first and second hard mask layers may include different materials having etch selectivity or different etch rates in a subsequent etching process. The first and second hard mask layers may or may not include at least one same material.

In S20, a plurality of mandrel lines may be formed on the hard mask layer, referring below to FIGS. 2A-3B.

The plurality of mandrel lines may be formed by depositing a mandrel layer on the hard mask layer, and patterning the mandrel layer using a photolithography process. For example, the mandrel layer may be or may include amorphous silicon. The plurality of mandrel lines may be a structure having both side surfaces extending in one direction. Each of the mandrel lines may define a region in which a structure (e.g., an interconnection line) to be formed in a subsequent process is formed.

In S30, spacers may be formed, e.g. may be deposited, on both sidewalls of each of the plurality of mandrel lines, referring below to FIGS. 4A and 4B.

A spacer material layer may be conformally formed on the hard mask layer on which the plurality of mandrel lines are formed. Specifically, the spacer material layer may be conformally formed on upper and side surfaces of the plurality of mandrel lines, and on a portion of the hard mask layer between the plurality of mandrel lines. The spacer material layer may be deposited by a process such as, for example, an atomic layer deposition (ALD) process. The spacer material layer may include, for example, one or more of silicon oxide, silicon nitride, titanium oxide, titanium nitride, or boron nitride. A thickness of the spacer material layer may be proportional to a pitch and/or a width of the final pattern.

Then, the spacer material layer may be etched back to form the spacers on both sidewalls of each of the plurality of mandrel lines. In the etching back process for forming the spacers, a portion of the hard mask layer between the spacers that are respectively disposed on opposite sidewalls of adjacent mandrel lines may be exposed, together with the upper surfaces of the plurality of mandrel lines. The etching back process may be performed as an anisotropic etching process, such as in a reactive ion etching (RIE) process.

Figure 5A:
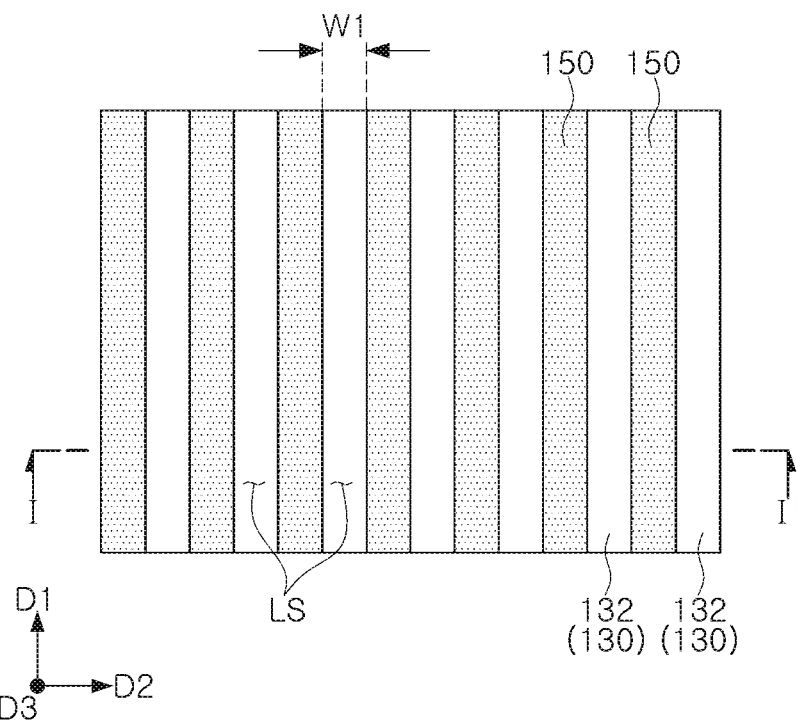
Figure 5B:
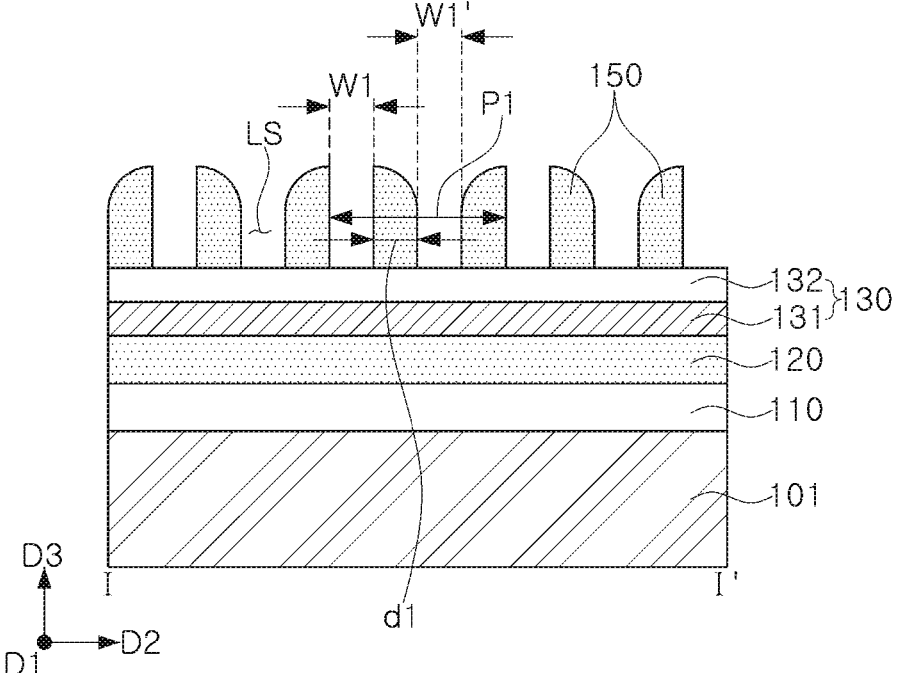

In S40, the mandrel lines may be selectively removed from the spacers, referring to FIGS. 5A and 5B).

Remaining portions of the spacers may each have a constant width, and may be arranged at a constant pitch. A space between the remaining portions of the spacers may be a linear space extending in one direction, respectively. Each of these linear spaces may define a target pattern (e.g., an interconnection line) having a design width, e.g., a minimum width. For example, a width of the linear space corresponds to the design width, e.g., the minimum width of the target pattern. The design width or the minimum width may be or may correspond to a smallest width of a target pattern hat is to be formed on the semiconductor device.

Thereafter, opening patterns to be desired may be sequentially formed in the hard mask layer by a photolithography process using the spacers, referring to FIGS. 6A-16B.

These opening patterns may include opening patterns adjacent to each other in an extension direction thereof in one linear space. The opening patterns may be also referred to as first and second linear spaces, respectively. The first and second linear spaces may be formed by different photolithography processes, to minimize or reduce an interval between the first and second linear spaces (e.g., 20 nm or less).

In S50, a first photolithography etching process for forming a first linear opening in the hard mask layer may be performed, referring to FIGS. 6A-8B.

A first photoresist layer may be formed on the hard mask layer on which the spacers are formed, and a first photomask having the first opening may be formed from the first photoresist layer using the first photolithography process. In this case, the first opening may be formed to expose a first linear space defined as a first region of a space between adjacent spacers, among the spacers.

The first linear opening corresponding to the first linear space may be formed in the hard mask layer by etching the hard mask layer using the first photomask. In some example embodiments, some regions of the adjacent spacers may be exposed by the first opening, and exposed regions of the adjacent spacers may act as a mask, together with the first photomask, in a process of forming the first linear opening, and may define a width of a second linear opening.

Next, in S60, similarly to the first photolithography etching process, a second photolithography etching process for forming a second linear opening in the hard mask layer may be performed, referring to FIGS. 9A-11B).

This process may be performed after removing the first photomask. After removing the first photomask, a second photoresist layer may be formed on the hard mask layer on which the spacers are formed, and a second photomask having the second opening may be formed from the second photoresist layer using the second photolithography process. In this case, the second opening may be formed to expose a second linear space defined as a second region of the space between the adjacent spacers. As such, the second linear space may be located neighboring or adjacent to the first linear space in an extension direction thereof in the same space of the adjacent spacers. For example, an interval between the first and second linear spaces may be 20 nm or less (e.g., 18 nm or 14 nm or less).

The hard mask layer may be etched using the second photomask to form a second linear opening corresponding to the second linear space in the hard mask layer. In various example embodiments, some regions of the adjacent spacers may be exposed by the second opening, and exposed regions of the adjacent spacers may act as a mask together with the second photomask, in a process of forming the second linear opening, and may define a width of a second linear opening.

Additionally, in S70, a third photolithography etching process for forming a third linear opening having a width, different from the width of each of the first and second linear openings, may be performed in the hard mask layer, referring to FIGS. 12A-14B).

This process may be performed after removing the second photomask. After forming a third photoresist layer on the hard mask layer in which the spacers are formed, a third photomask having the third opening may be formed from the third photoresist layer using the third photolithography process. In this case, the third opening may have a width, greater than the width of each of the first and second openings. Also, the third opening may expose at least one spacer, among the plurality of spacers.

Unlike the previous first and second photolithography etching processes, by using the third photomask, an exposed portion of the at least one spacer may be removed, and the hard mask layer may be etched to form a wide opening having a relatively wide width in the hard mask layer.

In some example embodiments, the third photolithography etching process may be performed after the first and second photolithography etching processes, but example embodiments are not limited thereto, and may be performed in any other order. For example, the third photolithography etching process may be performed prior to the first and second photolithography etching processes or performed between the first and second photolithography etching processes.

A hard mask layer having openings such as design or desired openings may be formed by the above-described processes. Next, in S80, a final pattern may be formed by etching the target layer using a patterned hard mask layer (please refer to FIGS. 15A, 16A, and 17A, and FIGS. 15B, 16B, and 17B).

As described above, according to the various example embodiments, a fine interval (e.g., 20 nm or less) that may be difficult to expect with a conventional cut-off process may be formed, by using different photolithography processes using spacers for the first and second linear openings adjacent in a line extension direction.

In various example embodiments, an additional linear opening may be formed in conjunction with at least one of the first or second photolithography etching process (please refer to FIGS. 9A, 10A, and 11A, and FIGS. 9B, 10B, and 11B). Also, in various example embodiments, a process for forming the wide opening may be replaced with a process using a separate wide mandrel pattern for the third photolithography etching process, referring to FIGS. 22A-26B.

Hereinafter, a method of fabricating a semiconductor device according to various example embodiments will be described in more detail with reference to FIGS. 2A to 20. A method of fabricating a semiconductor device, illustrated in FIGS. 2A to 20, may be understood as a process for forming an interconnection structure (e.g., BEOL) using a dielectric layer as a target layer, and for convenience of explanation, a method of fabricating a semiconductor device will be described separately as a spacer (self-aligned pattern) forming process, a hard mask pattern forming process, and an interconnection line forming process.

① Formation of Spacers, Self-Aligned Mask Patterns

FIGS. 2A, 3A, 4A, and 5A are plan views illustrating some processes (spacer formation) of a method of fabricating a semiconductor device according to various example embodiments, and FIGS. 2B, 3B, 4B, and 5B are cross-sectional views of the planes of FIGS. 2A, 3A, 4A, and 5A, respectively, taken along line I-I'. A series of processes illustrates a process of forming mandrel lines using a photolithography process, and a process of forming spacers (e.g., self-aligned mask patterns) using the same.

Figure 2A:
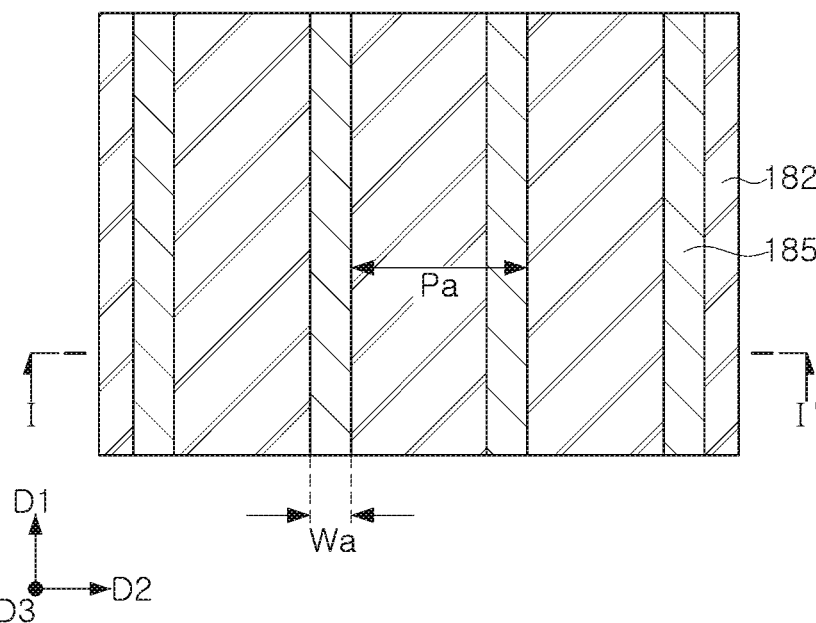
FIGS. 2A, 3A, 4A, and 5A are plan views illustrating some processes (spacer formation) in a method of fabricating a semiconductor device according to various example embodiments.
Figure 2B:
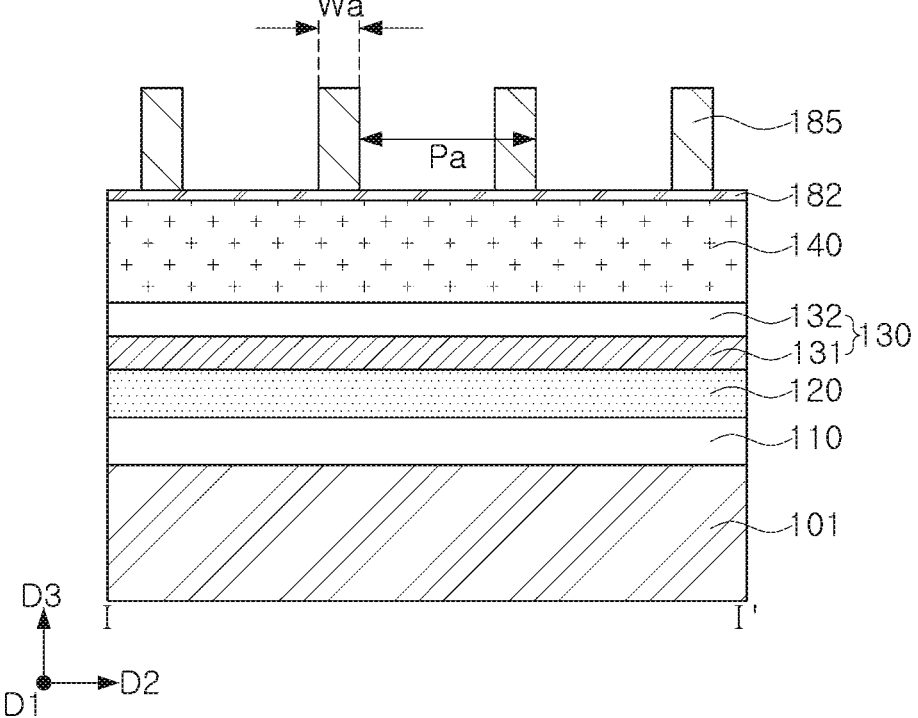
FIGS. 2B, 3B, 4B, and 5B are cross-sectional views of the planes of FIGS. 2A, 3A, 4A, and 5A, respectively, taken along line I-I'.

Referring to FIGS. 2A and 2B, a substrate 101 on which an interlayer insulating layer 110 is disposed is illustrated. A dielectric layer 120 on which interconnection lines are formed may be deposited or formed on the interlayer insulating layer 110, and a hard mask layer 130 and a mandrel layer 140 may be sequentially stacked on the dielectric layer 120. A photoresist pattern 185 as a mask structure for patterning the mandrel layer 140 may be deposited or formed on the mandrel layer 140. An anti-reflection film 182 may be deposited or formed between the photoresist pattern 185 and the mandrel layer 140. For example, the anti-reflection film 182 may include one or more of titanium, titanium dioxide, titanium nitride, chromium oxide, carbon, silicon nitride, silicon oxynitride, or amorphous silicon.

Photoresist patterns 185 may extend in a first direction D1, respectively, and may be arranged in a second direction D2. The photoresist pattern 185 may define a pattern of a desired mandrel line. The photoresist patterns 185 may have a first width Wa in the second direction D2, respectively, and may be arranged at a first pitch Pa.

The substrate 101 may be a semiconductor substrate or a multilayers substrate such as a silicon-on-insulator (SOI. The semiconductor substrate may include, for example, one or more of silicon (Si), germanium (Ge), silicon germanium (SiGe), silicon carbide (SiC), gallium nitride (GaN), or gallium arsenide (GaAs). The substrate 101 may be an undoped semiconductor substrate, or may be semiconductor substrate doped with impurities, to have p-type and/or n-type, and may include an active region in which devices such as transistors are formed.

The interlayer insulating layer 110 may be disposed on a surface of the substrate 101 on which the active region is formed. The interlayer insulating layer 110 may have a front-end-of-line (FEOL) structure and/or a middle-of-line (MOL) structure. The interlayer insulating layer 110 may include a material such as silicon oxide and/or a low-κ material. For example, the interlayer insulating layer 110 may include a flowable oxide (FOX), Tonen Silazen (TOSZ), undoped silica glass (USG), borosilicate glass (BSG), phosphosilacate glass (PSG), borophosphosilicate glass (BPSG), plasma enhanced tetra ethyl ortho silicate (PETEOS), fluoride silicate glass (FSG), a high density plasma (HDP) oxide, a plasma enhanced oxide (PEOX), a flowable CVD (FCVD) oxide, or a combination thereof.

The dielectric layer 120 may be provided as a region for forming an interconnection line such as BEOL, and the dielectric layer 120 may be formed on the interlayer insulating layer 110, with an etch-stop layer (not illustrated)

interposed therebetween. An interconnection line to be formed on the dielectric layer 120 in a subsequent process may be electrically connected to the active region through a contact structure (not illustrated) located in the interlayer insulating layer 110. The dielectric layer 120 may include one or more of tetraethyl ortho silicate (TEOS), silicon oxide ($SiO_2$), silicon oxynitride (SiON), nanoporous silica, hydrogen silsesquioxanes (HSQ), Teflon-AF (polytetrafluoroethylene or PTFE), and silicon oxyfluoride (FSG), carbon doped $SiO_2$ (SiCO), hydrogenated silicon oxycarbide (SiCOH), or a low-κ material or an ultra-low-k (ULK) dielectric material (e.g., dielectric constant less than or equal to 2.5).

The hard mask layer 130 employed in various example embodiments may include first and second hard mask layers 131 and 132, sequentially stacked on the dielectric layer 120. The first and second hard mask layers 131 and 132 may include different materials having etch selectivity in a subsequent etching process. The first hard mask layer 131 may etch slower than, or faster than, the second hard mask layer 132. For example, the first hard mask layer 131 may include a metal compound such as titanium nitride suitable as a mask material for the dielectric layer 120, and the second hard mask layer 132 may include a dielectric material such as silicon oxide, silicon oxynitride, or silicon nitride. The mandrel layer 140 may include a material having high etch selectivity with respect to the second hard mask layer 132, which may be located in a lower portion thereof. For example, the mandrel layer 140 may include amorphous silicon. For example, the first and second hard mask layers 131 and 132 and the mandrel layer 140 may be formed by various deposition processes such as one or more of physical vapor deposition (PVD), chemical vapor deposition (CVD), and atomic layer deposition (ALD).

The photoresist pattern 185 may be formed by coating (e.g., spin coating) a photoresist material on the mandrel layer 140, and then by performing baking, exposing, and developing processes. The photoresist pattern 185 may use a positive tone development process using a positive tone resist, or may use a negative tone development (NTD) process using a solvent-based developer. Exposure for forming the photoresist pattern 185 may be performed by, for example, extreme ultraviolet (EUV) (e.g., 13.5 nm), but example embodiments are not limited thereto, and other exposure equipment such as an argon-fluorine (ArF) excimer laser (193 nm) may be used in lieu of or in addition to the EUV process. In a subsequent process, the photoresist pattern 185 may be patterned to have an image corresponding to a desired mandrel line ("140L" in FIGS. 3A and 3B).

Figure 3A:
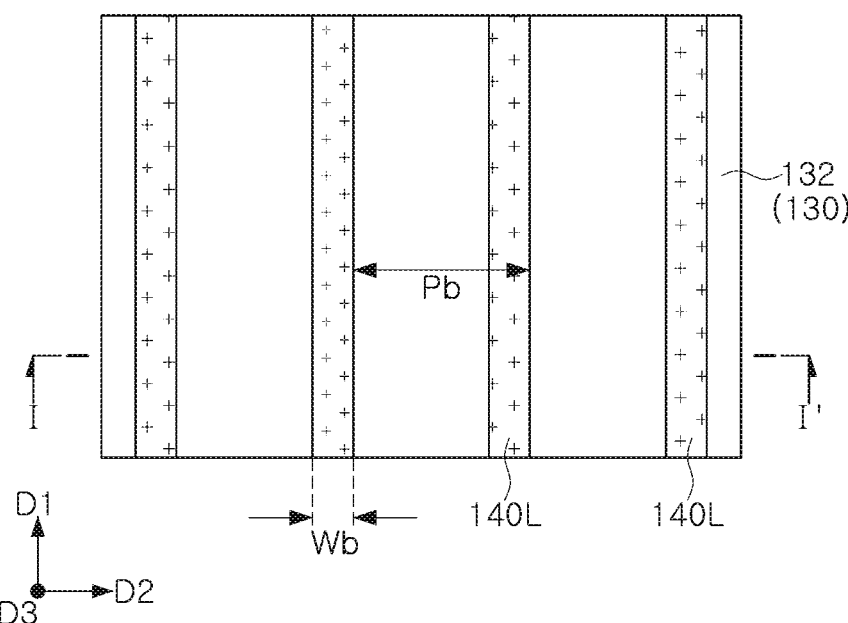
Figure 3B:
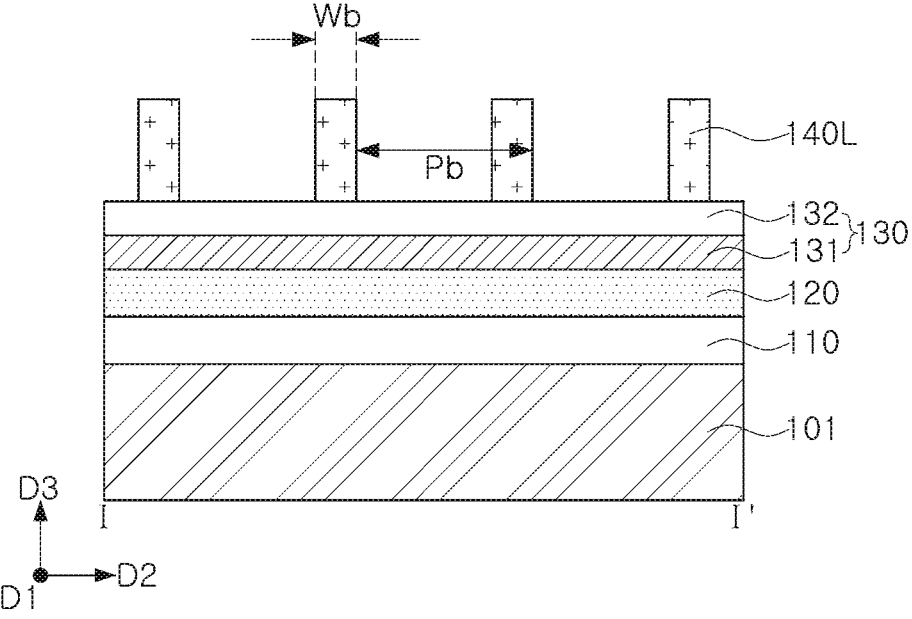

Referring to FIGS. 3A and 3B, a plurality of mandrel lines 140L may be formed from the mandrel layer 140 using the photoresist pattern 185.

A plurality of mandrel lines 140L may be formed by patterning the mandrel layer 140 using the photoresist pattern 185. The plurality of mandrel lines 140L may be patterns obtained by transferring the photoresist pattern 185. The plurality of mandrel lines 140L may extend in the first direction D1, and may be spaced apart from each other in the second direction D2, intersecting the first direction D1. Also, the plurality of mandrel lines 140L may have sidewalls, e.g. two sidewalls, with both sidewalls extending in the first direction D1. The photoresist pattern 185 may have a second width Wb corresponding to the first width Wa in the second direction D2, and may be arranged at a second pitch Pb corresponding to the first pitch Pa. This process may be performed, for example, by an anisotropic process such as reactive ion etching (RIE).

Figure 4A:
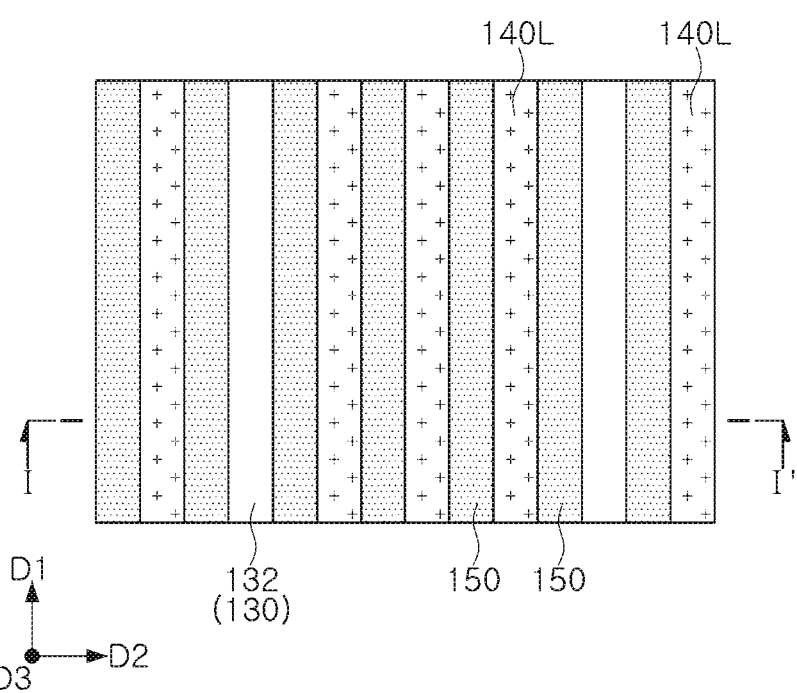
Figure 4B:
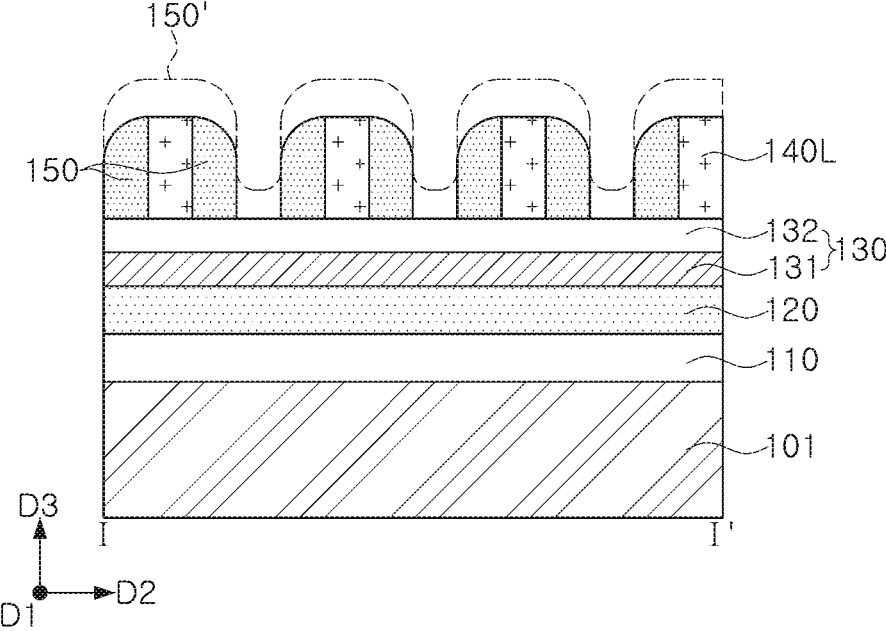

Referring to FIGS. 4A and 4B, spacers 150 may be formed on both sidewalls of each of the plurality of mandrel lines 140L.

A spacer material layer 150' may be conformally formed on the hard mask layer 130 in which the plurality of mandrel lines 140L are arranged. A spacer material layer 150' for a sidewall spacer 150 may be formed on an upper surface of the second hard mask layer 132 to cover upper and side surfaces of the plurality of mandrel lines 140L. For example, the spacer material layer 150' may be conformally deposited using a process such as an ALD process. The spacer material layer 150' may provide the sidewall spacer (also referred to as a self-aligned pattern or SAP) in a subsequent process. The spacer material layer may include, for example, one or more of silicon oxide, silicon nitride, titanium oxide, titanium nitride, or boron nitride.

A thickness of the spacer material layer 150' may substantially correspond to a width d1 of the spacer 150 in FIGS. 5A and 5B. Therefore, the spacer material layer 150' tends to be thin in order to realize a fine-pitch pattern. For example, the thickness of the spacer material layer 150' may be 20 nm or less, and, in various example embodiments, may be 15 nm or less, and, further, may be 10 nm or less.

Next, an etch-back may be applied to the spacer material layer 150' to form the sidewall spacer 150. The spacers 150 may be formed on both sidewalls 140S of each of the plurality of mandrel lines 140L by etching back the spacer material layer 150'. For example, the etch-back for forming the spacers 150 may be performed using an anisotropic process such as a RIE process. In this process, while exposing the hard mask layer 130 on upper surfaces of the plurality of mandrel lines 140L and between the plurality of mandrel lines 140L, a portion of the spacer material layer located on both sidewalls of the plurality of mandrel lines 140L may remain, and the remaining portion may provide a spacer 150 for a mask pattern. An interval W between the spacers 150 may substantially correspond to an interval W' of a removed portion of each of the mandrel lines, and may define a design width or a minimum width of a final target pattern (e.g., the interconnection line). The spacer 150 obtained by this process may be also referred to as a "self-aligned pattern".

Referring to FIGS. 5A and 5B, a self-aligned pattern formed of the spacer 150 may be obtained by selectively removing the mandrel line 140L.

Spaces between the spacers 150, which may be the self-aligned pattern, may be provided as "linear spaces LS" extending in the first direction D1. Intervals W1 and W1' of the linear spaces LS may define a design width of a minimum width of a target pattern, respectively, and a pitch P1 of each of the linear spaces LS may define a pitch of a target pattern adjacent thereto.

②︎ Patterning of Hard Mask Layer Using Photolithography Etching

Next, a series of processes for forming a hard mask pattern (e.g., a pattern of the first hard mask layer 131) for a desired target pattern (interconnection lines) using a photolithography etching process, together with the spacer 150 serving as a self-aligned mask pattern, may be performed.

FIGS. 6A, 7A, 8A, 9A, 10A, 11A, 12A, 13A, 14A, and 15A are plan views illustrating a process for forming a hard mask pattern in a method of fabricating a semiconductor device according to various example embodiments, and FIGS. 6B, 7B, 8B, 9B, 10B, 11B, 12B, 13B, 14B, and 15B are cross-sectional views of the planes of FIGS. 6A, 7A, 8A, 9A, 10A, 11A, 12A, 13A, 14A, and 15A, respectively, taken along line I-I'.

②-a) Formation of First Linear Opening using First Photolithography Etching

First and second photolithography etching processes for forming first and second linear openings L1 and L2 adjacent to the hard mask layer 130 in the first direction may be sequentially performed, referring to FIGS. 6A-11B).

Figure 6A:
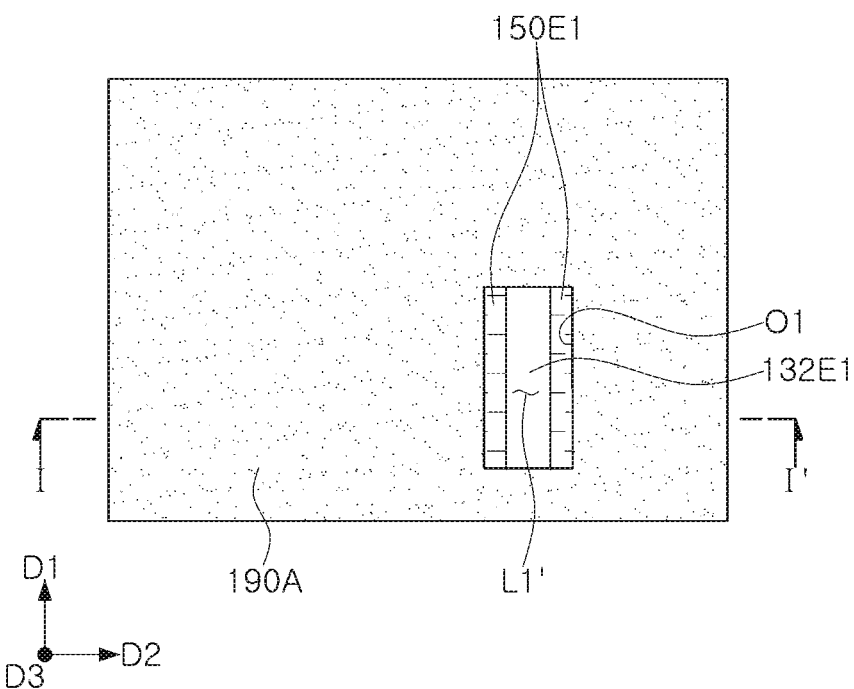
FIGS. 6A, 7A, 8A, 9A, 10A, 11A, 12A, 13A, 14A, 15A, and 16A are plan views illustrating some processes (hard mask formation) in a method of fabricating a semiconductor device according to various example embodiments.
Figure 6B:
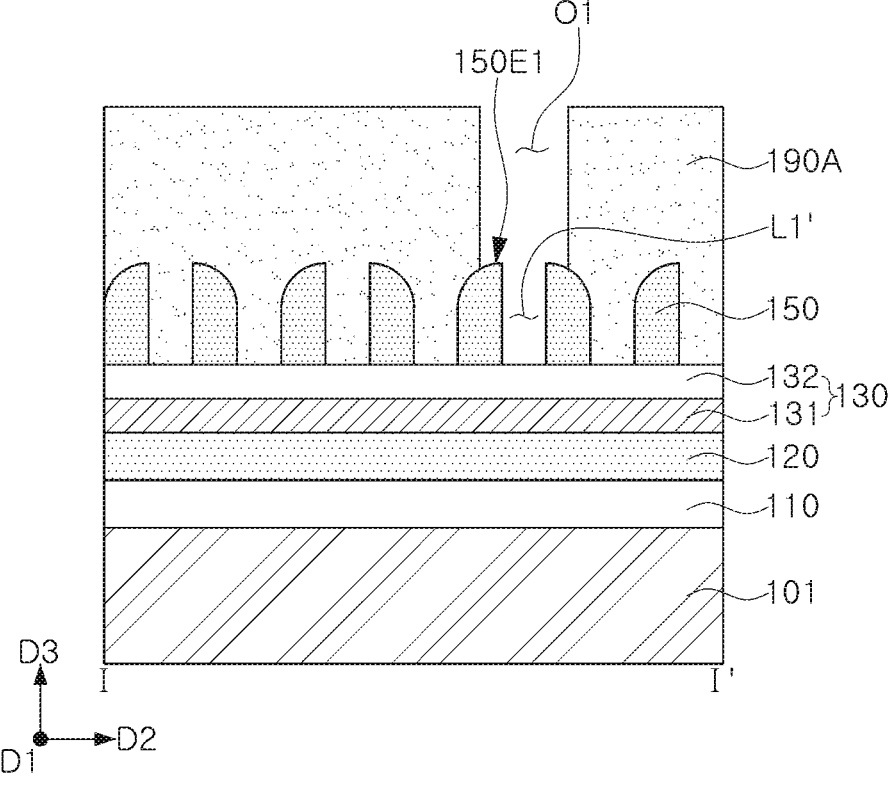
FIGS. 6B, 7B, 8B, 9B, 10B, 11B, 12B, 13B, 14B, 15B, and 16B are cross-sectional views of the planes of FIGS. 6A, 7A, 8A, 9A, 10A, 11A, 12A, 13A, 14A, 15A, and 16A, respectively, taken along line I-I'.

Referring to FIGS. 6A and 6B, a first photomask 190A having a first opening O1 on the hard mask layer 130 (for example, the second hard mask layer 132) on which the spacers 150 are formed may be formed.

A first photoresist layer may be formed on the hard mask layer 130 on which the spacers 150 may be formed, and a first photomask 190A having a first opening O1 from the first photoresist layer using a first photolithography process. In this case, the first opening O1 may be formed to expose a first linear space L1' defined as a first region of a space between adjacent spacers, among the spacers 150. A region 150E1 of the adjacent spacers may be exposed by the first opening O1.

The first linear space L1' may be defined by the first opening O1 of the first photomask 190A in the first direction D1, and may be defined by the exposed region 150E1 of the adjacent spacers in the second direction D2.

Figure 7A:
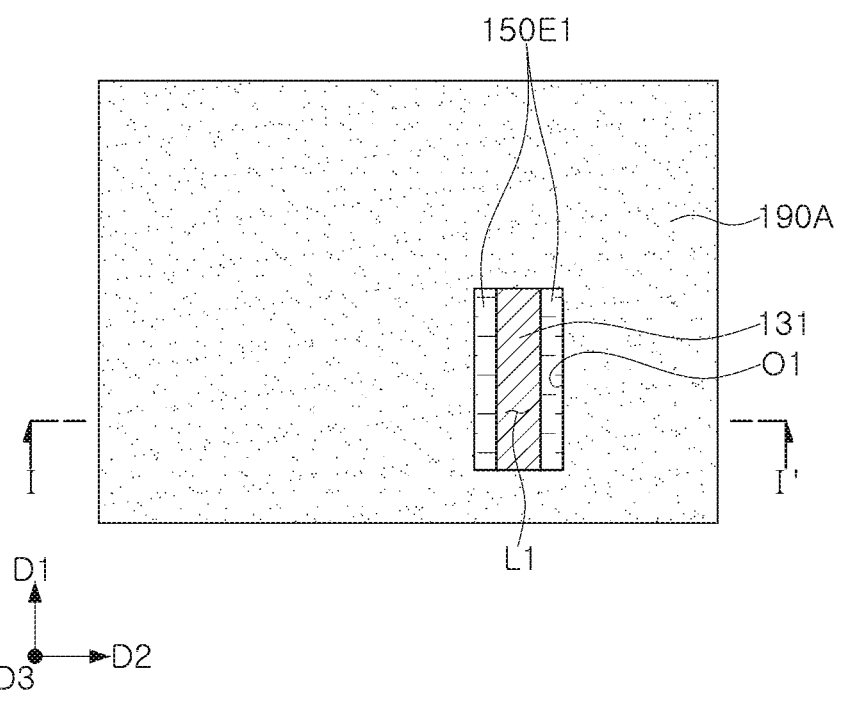
Figure 7B:
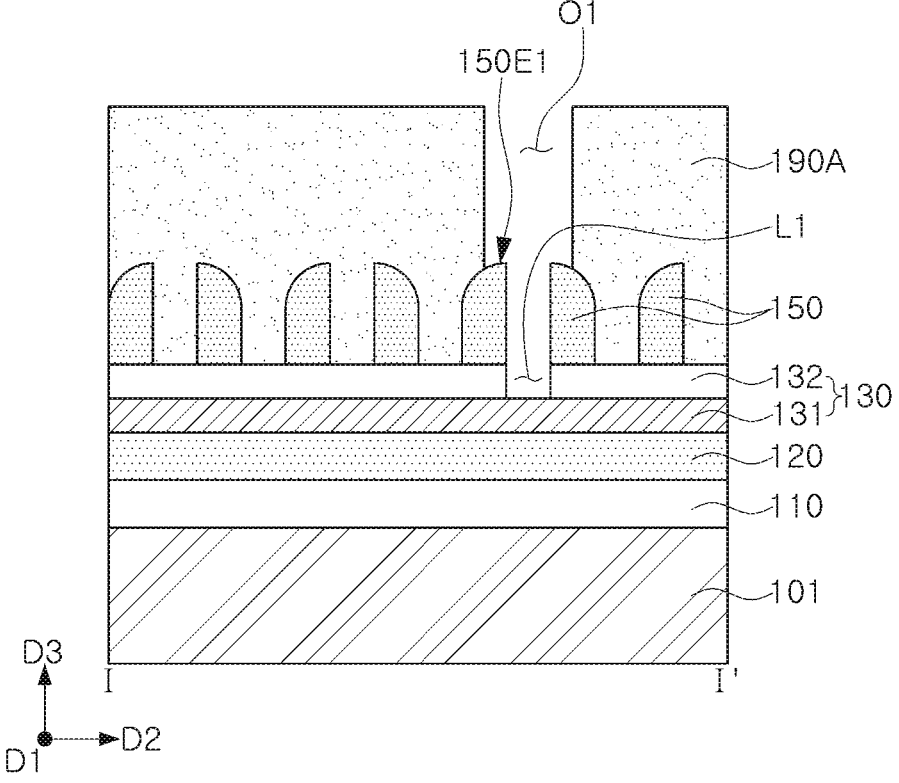

Next, referring to FIGS. 7A and 7B, the second hard mask layer 132 may be etched using the first photomask 190A to form a first linear opening L1 corresponding to the first linear space L1' in the second hard mask layer 132.

In some example embodiments, in a process of forming the first linear opening L1, the exposed region 150E1 of the adjacent spacers, together with the first photomask 190A, may act as a mask. For example, the first linear opening L1 may be defined by the first opening O1 of the first photomask 190A in the first direction D1, and may be defined by the exposed region 150E1 of the adjacent spacers in the second direction D2.

Figure 8A:
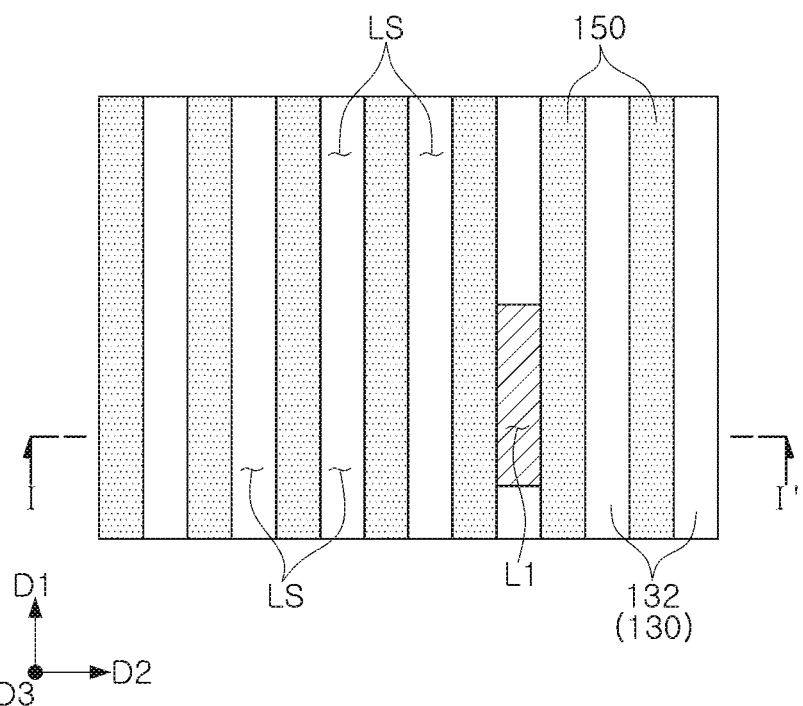
Figure 8B:
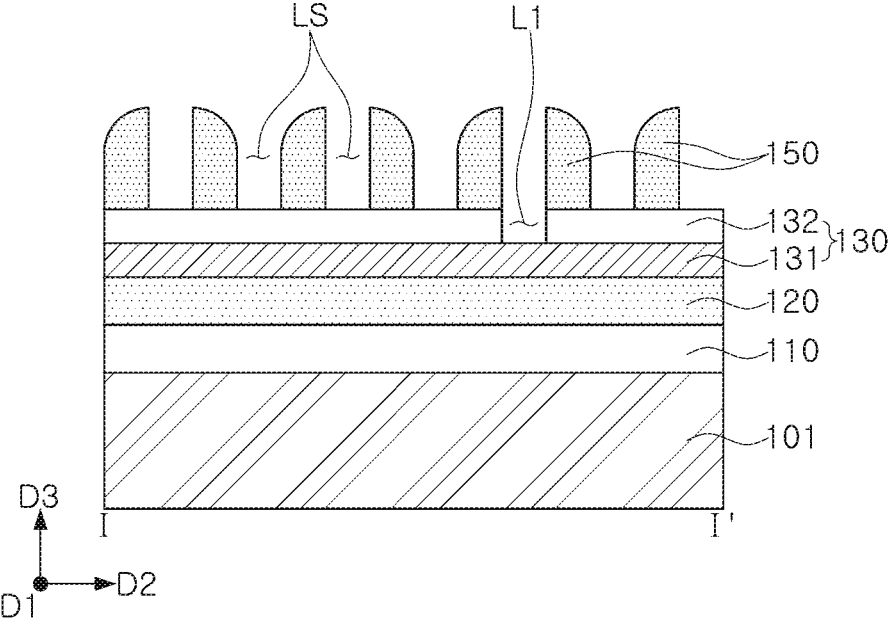

Next, referring to FIGS. 8A and 8B, the second hard mask layer 132 in which the spacers 150 and the first linear opening L1 are formed may be exposed again by removing the first photomask 190A. A process of removing the first photomask 190A may be performed by an ashing process and/or a strip process.

②-b) Formation of Second Linear Opening using Second Photolithography Etching

Figure 9A:
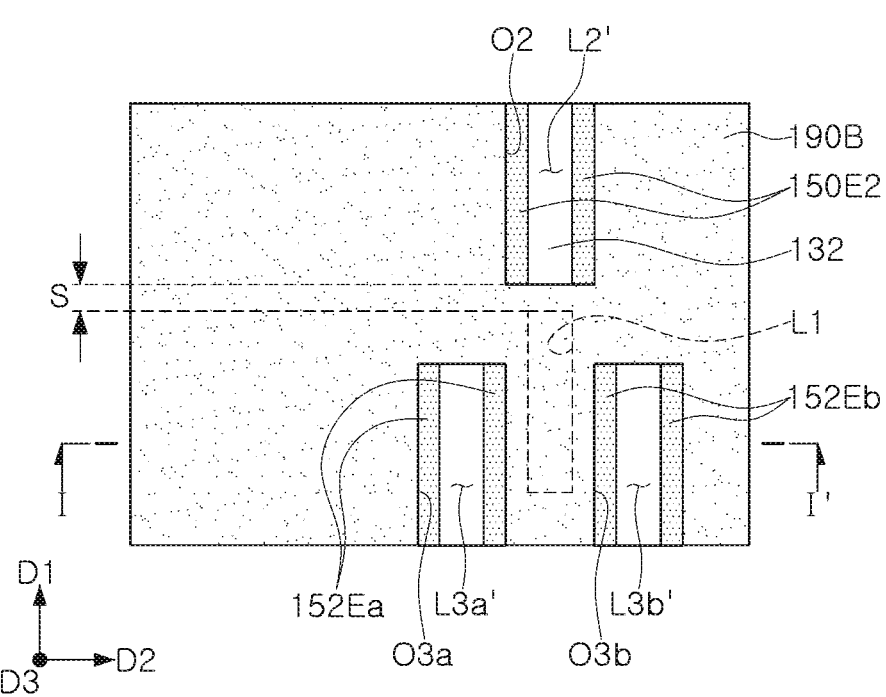
Figure 9B:
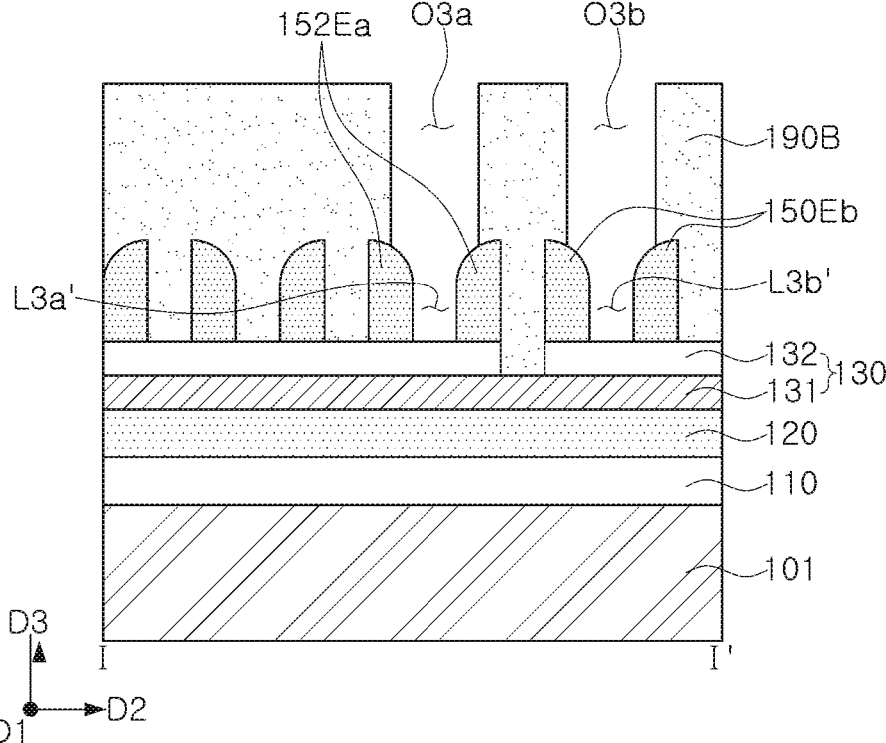

Next, referring to FIGS. 9A and 9B, a second photomask 190B having a second opening O2 may be formed on the second hard mask layer 132. In some example embodiments, the second photomask 190B may further include at least one additional opening (e.g., O3a and O3b) for exposing an additional third linear space (e.g., L3a' and L3b'). The additional opening (e.g., O3a and O3b) may have a width, identical to a width of the second opening O2.

A second photoresist layer may be formed on the second hard mask layer 132 on which the spacers 150 are formed, and a second photomask 190B having the second opening O2 and the additional opening (e.g., O3a and O3b) may be formed from the second photoresist layer using a second photolithography process. In this case, the second opening O2 may be formed to expose a second linear space L2' defined as a second region of the space between the adjacent spacers, among the spacers 150. The additional opening (e.g., O3a and O3b) may be formed to expose the additional third linear space (e.g., L3a' and L3b') defined as at least a partial region of a space between other adjacent spacers. In this case, the first and second linear spaces L1' and L2' may be defined as different spaces between the same adjacent spacers, and may be spaced apart from each other and arranged side by side in the first direction D1. In the second linear space L2', an interval between the second linear space L2' and the first linear opening L1 in the first direction D1 may be adjusted to a minute interval S. For example, the interval S may be 20 nm or less.

In addition, a region 150E2 of the adjacent spacers may be exposed by the second opening O2. The second linear space L2' may be defined by the second opening O2 of the second photomask 190B in the first direction D1, and may be defined by the exposed region 150E2 of the adjacent spacers in the second direction D2. Similarly, regions 150Ea and 150Eb of the other adjacent spacers may be exposed by the additional openings O3a and O3b, respectively, and the third linear spaces L3a' and L3b' may be defined by the additional openings O3a and O3b of the second photomask 190B in the first direction D1, respectively, and may be defined by the exposed regions 150Ea and 150Eb of the adjacent spacers in the second direction D2, respectively.

In some example embodiments, the additional third linear spaces L3a' and L3b' are illustrated to have a shape defined by at least one region of the space between other adjacent spacers, but, in various example embodiments, may form an opening for an additional third linear space (not illustrated) defined by a third region of the space between the adjacent spacers defining the first and second linear spaces L1' and L2'. In various example embodiments, the additional third linear spaces L3a' and L3b' may not be formed in the second photomask 190B, but may be formed only in the first photomask 190A, or may be separately formed in the first and second photomasks 190A and 190B, respectively.

A process sequence may be appropriately selected according to positions of the additional third linear spaces L3a' and L3b'. For example, as in some embodiments, when the third linear spaces L3a' and L3b' may overlap and adjoin the first linear opening L1 in the second direction D2, the third linear spaces L3a' and L3b' may be formed in a photomask (e.g., 190B) other than the first photomask 190A for forming the first linear opening L1.

Figure 10A:
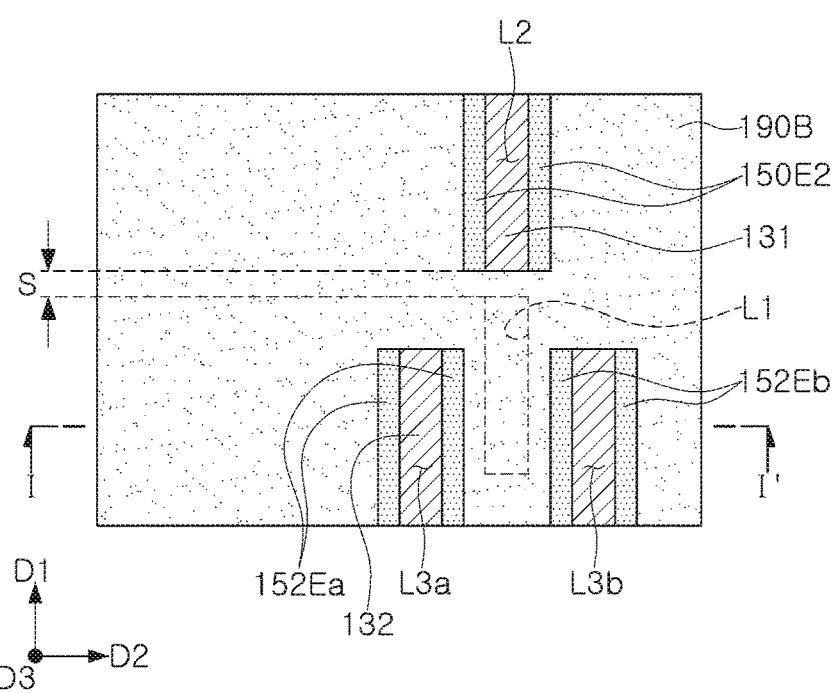
Figure 10B:
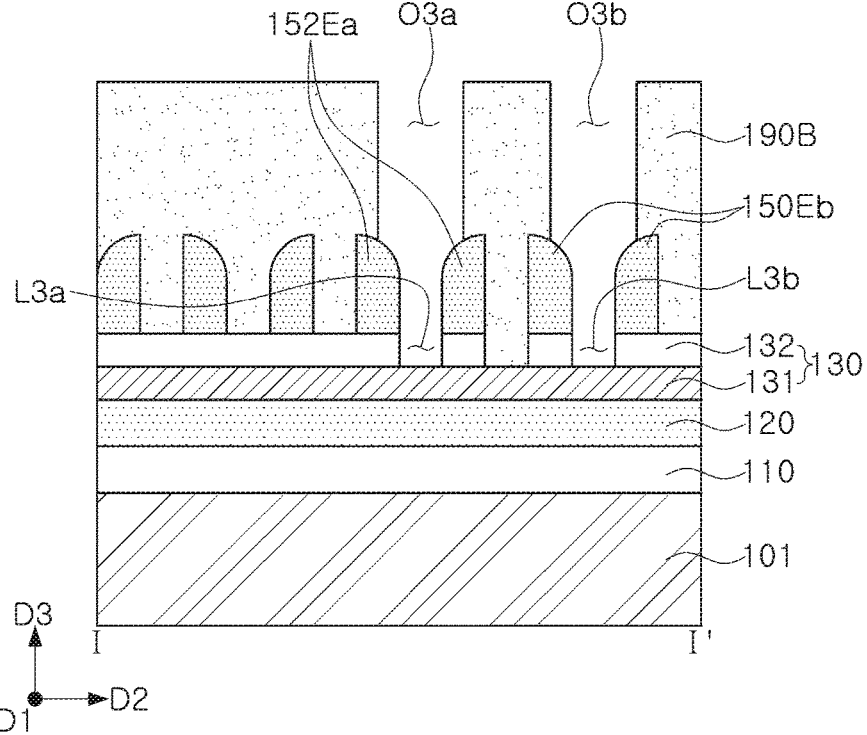

Next, referring to FIGS. 10A and 10B, the second hard mask layer 132 may be further etched using the second photomask 190B, to form a second linear opening L2 corresponding to L2' and second linear openings L3a and L3b respectively corresponding to the third linear spaces L3a' and L3b'.

In some example embodiments, in a process of forming the second linear opening L2, the exposed region 150E2 of the adjacent spacers together with the second photomask 190B may act as a mask. Similarly, in processes of forming the third linear openings L3a and L3b, the exposed regions 150Ea and 150Eb of the adjacent spacers together with the second photomask 190B may act as masks.

Figure 11A:
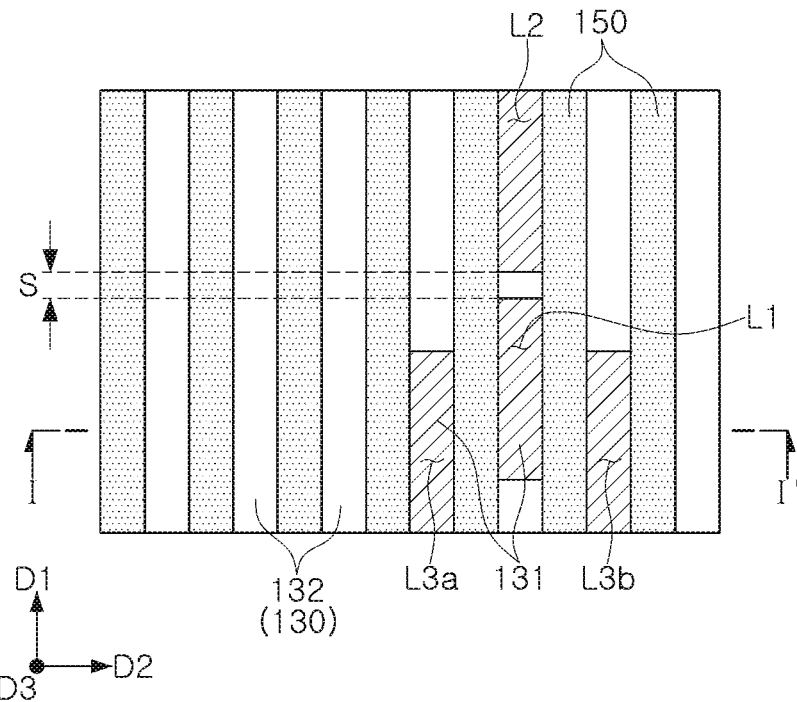
Figure 11B:
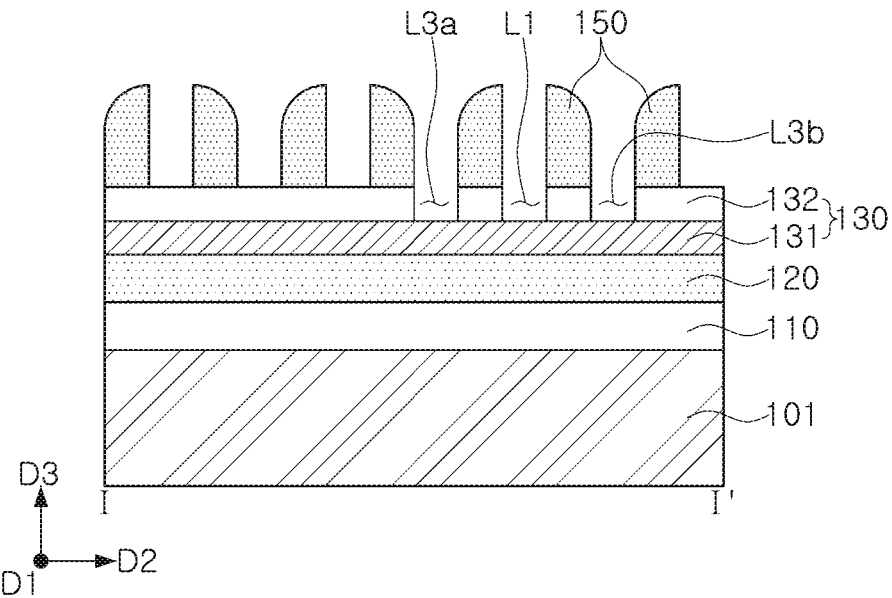

Next, referring to FIGS. 11A and 11B, the second photomask 190B may be removed to expose the second hard mask layer 132 having spacers 150 and the first to third linear openings L1, L2, L3a and L3b again. The second photomask 190B removal process may be performed by an ashing process and/or a stripping process, similarly to or different from the first photomask 190A removal process.

②-c) Formation of Wide Opening using Third Photolithography Etching

After forming the first to third linear openings, a third photolithography etching process for forming a wide opening OP having a width W2, greater than the widths W1 of the first and second linear openings L1 and L2, in the second hard mask layer 132 may be performed (please refer to FIGS. 12A, 13A, and 14A, and FIGS. 12B, 13B, and 14B).

Figure 12A:
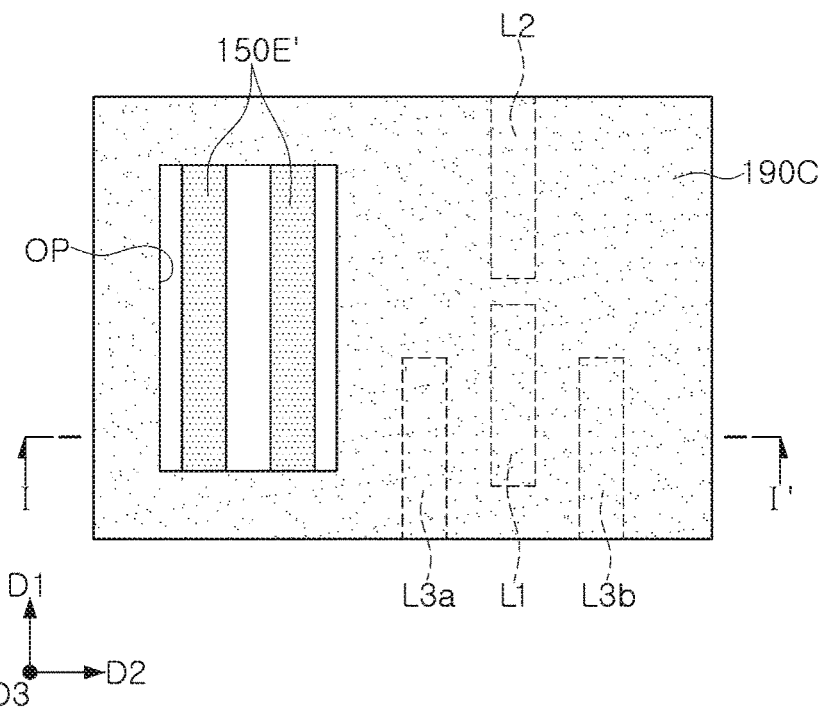
Figure 12B:
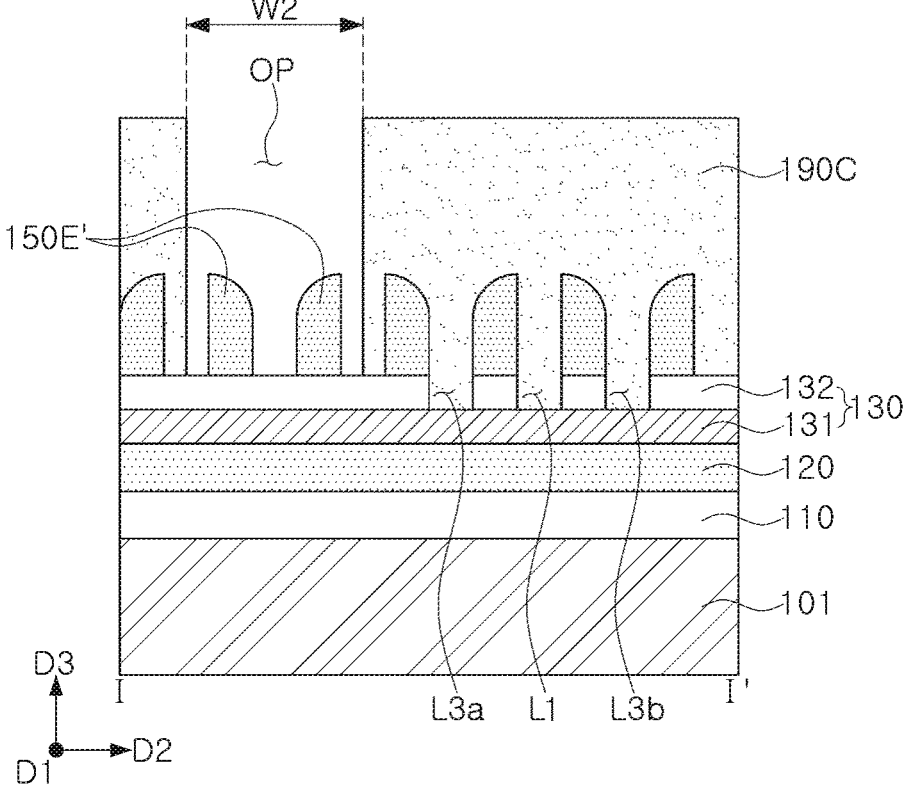

Referring to FIGS. 12A and 12B, after a third photoresist layer is formed on the hard mask layer 130 on which the spacers 150 are formed, a third photomask 190C having a third opening OP may be formed using a third photolithography process. In this case, the third opening OP may have a width W2, greater than the width W1 of each of the other openings O1, O2, O3a, and O3b. Also, the third opening OP may expose at least one spacer 150E', among the plurality of spacers 150. In some example embodiments, spacers 150E' exposed by the third opening OP may include regions of two spacers in the first direction, referring to FIG. 12A.

Figure 13A:
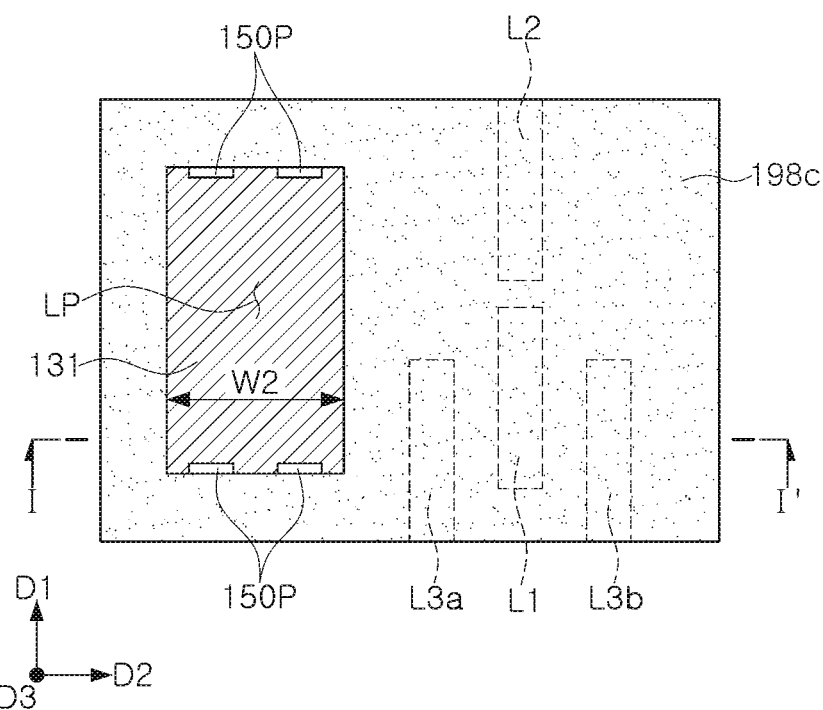
Figure 13B:
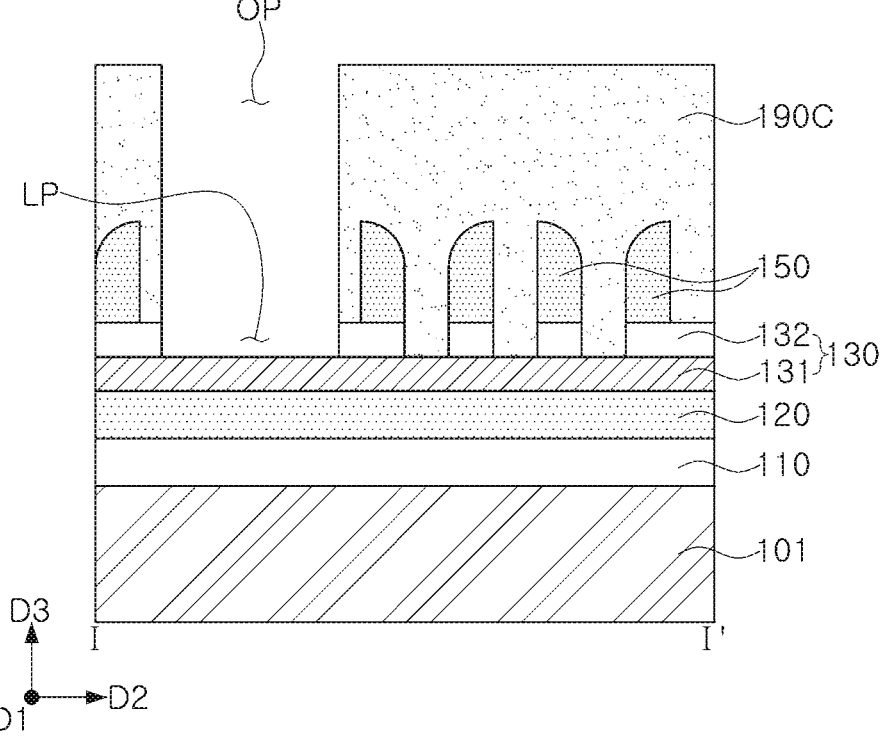

Next, referring to FIGS. 13A and 13B, a wide opening LP may be formed on the second hard mask layer 132 using the third opening OP of the third photomask 190C.

Unlike the first and second photolithography etching processes, the spacer portions 150E' exposed by the third opening OP may be removed using the third photomask 190C, and the second hard mask layer 132 may be etched, to form the wide opening LP having a relatively large width W2 in the second hard mask layer 132. The wide opening LP may have the width W2 extending across two spacers and adjacent spaces in the second direction D2.

In various example embodiments, a process of removing exposed portions of the spacer 150E' and a process of etching the second hard mask layer 132 may be simultaneously performed by a single etching process, e.g. within a single etching chamber. Sides of the wide opening LP facing in the first direction D1 may be curved (or non-straight lined) due to a difference in etch rates between a material of the spacer 150 and a material of the second hard mask layer 132. In some example embodiments, a case in which the material of the spacer 150 has an etch rate, lower than an etch rate of the material of the second hard mask layer 132, in the present etching process is illustrated. As illustrated in FIG. 13A, spacer portions 150P may protrude into the wide opening LP even after forming the wide opening LP, and a portion of the second hard mask layer 132 may remain thereunder.

Figure 14A:
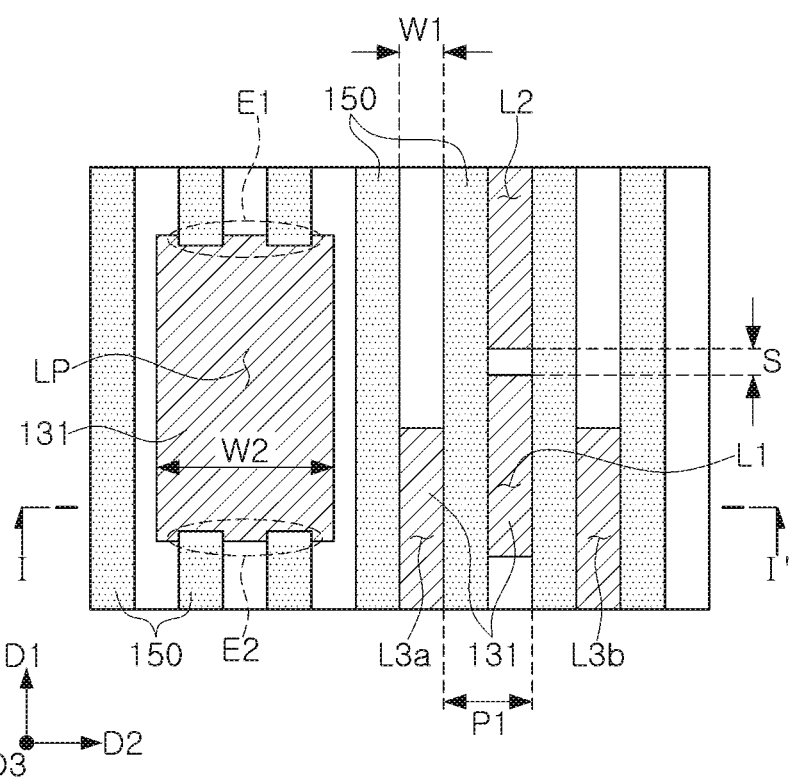
Figure 14B:
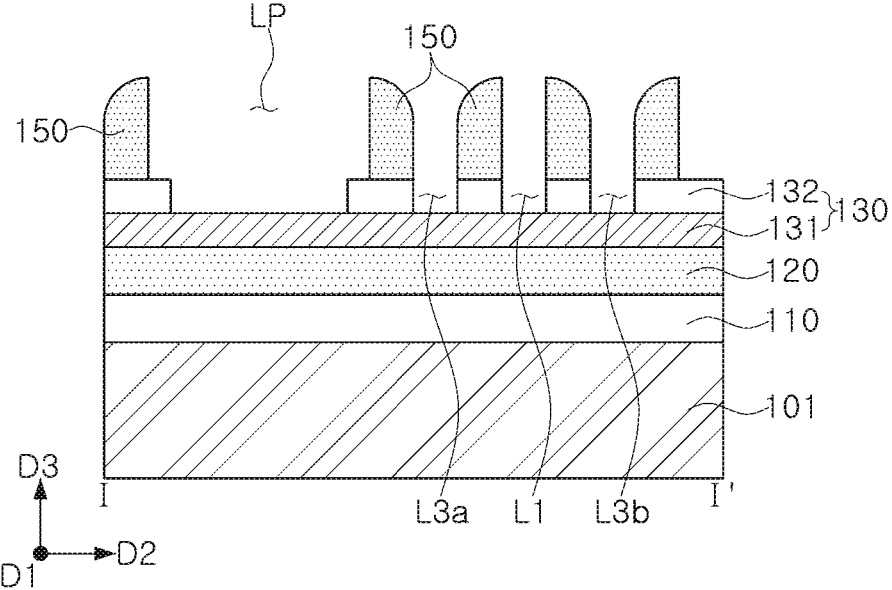

Next, referring to FIGS. 14A and 14B, the third photomask 190C may be removed to expose the second hard mask layer 132 on which the spacers 150, the first to third linear openings L1, L2, L3a, and L3b, and the wide opening LP are formed again. The third photomask 190C removal process may be performed by an ashing process and/or a stripping process, similarly to or different from the first and second photomasks 190A and 190B removal processes.

As described above, the spacer portions 150P may protrude into the wide opening LP and a portion of the second hard mask layer 132 may also remain thereunder, and as a result, the wide opening LP may have portions E1 and E2 in which sides opposing in the first direction D1 are curved.

Unlike the first to third linear openings L1, L2, L3a, and L3b, the wide opening LP may be an opening for forming an interconnection line or an interconnection pattern having a relatively large width, and may be, for example, an opening for an interconnection line constituting a peripheral circuit.

In some example embodiments, the third photolithography etching process may be performed after the first and second photolithography etching processes, but example embodiments are not limited thereto, and the photolithography etching process may be performed in any other order. For example, the third photolithography etching process may be performed prior to the first and second photolithography etching processes, or may be performed between the first and second photolithography etching processes.

②-d) Patterning Process of First Hard Mask Layer

The hard mask layer 130 employed in various example embodiments may include the first and second hard mask layers 131 and 132 formed of different materials having etch selectivity as described above. Patterns of the openings L1, L2, L3a, L3b, and LP for interconnection lines formed in the second hard mask layer 132 by the first to third photolithography etching processes may be transferred to the first hard mask layer 131. Process may be performed, referring to FIGS. 15A and 15B, and FIGS. 16A and 16B).

Figure 15A:
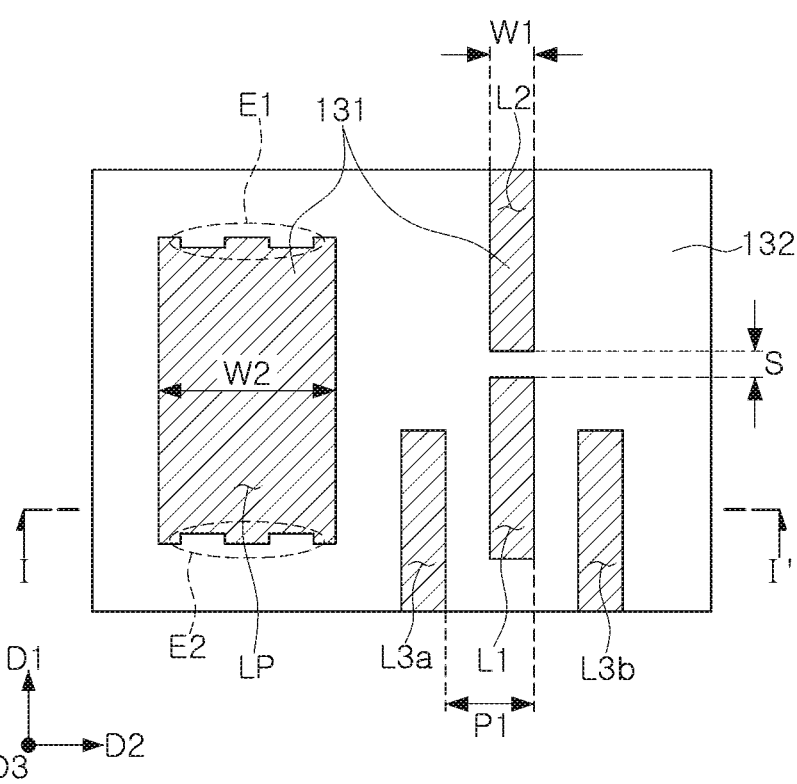
Figure 15B:
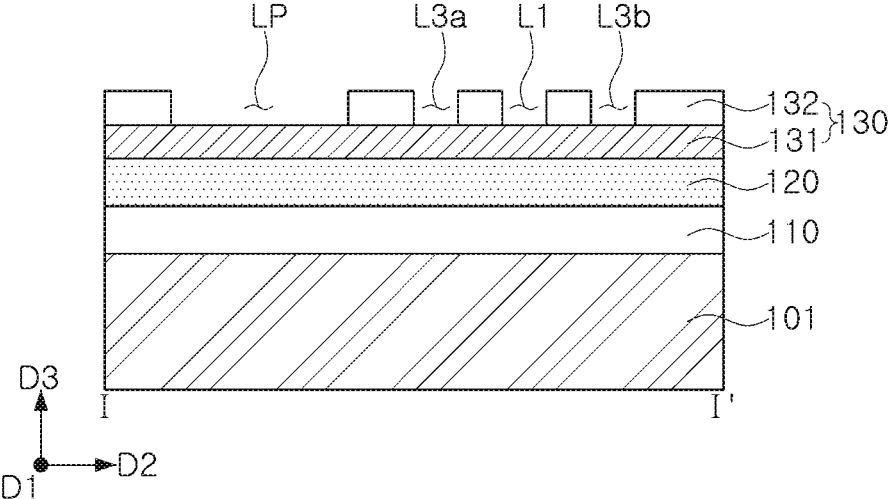
Figure 16A:
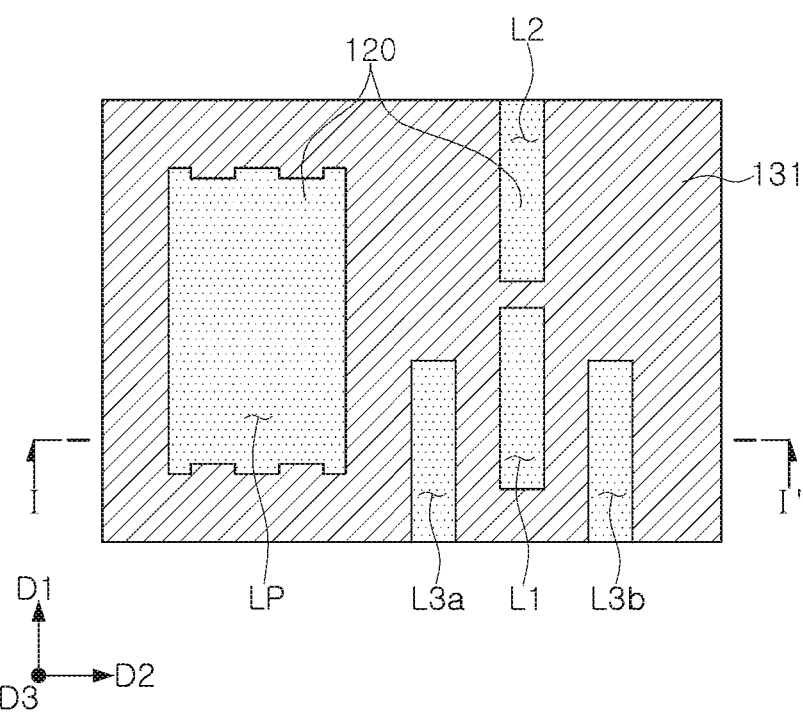
Figure 16B:
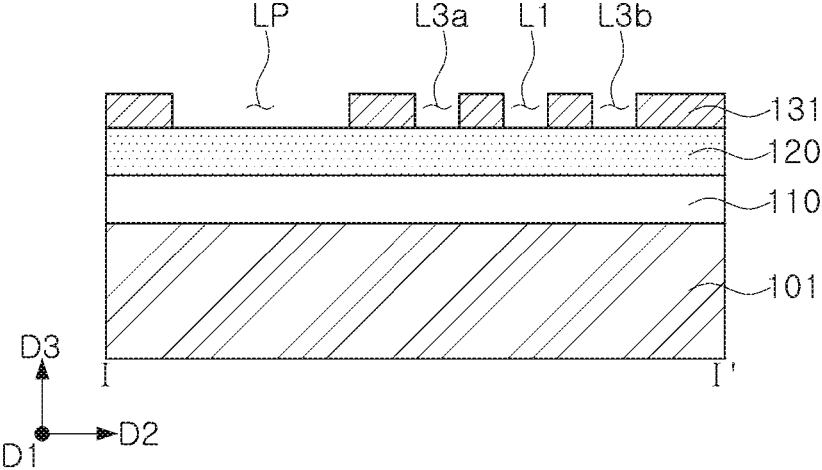

Referring to FIGS. 15A and 15B, the spacers 150 may be removed from the second hard mask layer 132, and then, referring to FIGS. 16A and 16B, the second hard mask layer 132 may be used, to pattern the first hard mask layer 131 and to remove the second hard mask layer.

The first and second hard mask layers 131 and 132 may include different materials. When the dielectric layer, which may be the target layer, has an etch rate similar to that of the second hard mask, an opening pattern for the interconnection line formed in the second hard mask layer 132 may be introduced by additionally introducing a first hard mask layer formed of a material that may act as a mask, to transfer patterns of the openings L1, L2, L3a, L3b, and LP for interconnection lines formed in the second hard mask layer 132 to the first hard mask layer 131. For example, the first hard mask layer 131 may include a metal compound such as titanium nitride suitable as a mask material for the dielectric layer 120, and the second hard mask layer 132 may include a dielectric material such as silicon oxide, silicon oxynitride, or silicon nitride.

③ Process of Forming Interconnection Line

Next, a process of forming an interconnection line may be performed using the patterned second hard mask layer. FIGS. 17A and 17B and FIGS. 18 to 20 are plan views or cross-sectional views illustrating some processes (interconnection line formation) of a method of fabricating a semiconductor device according to various example embodiments.

Figure 17A:
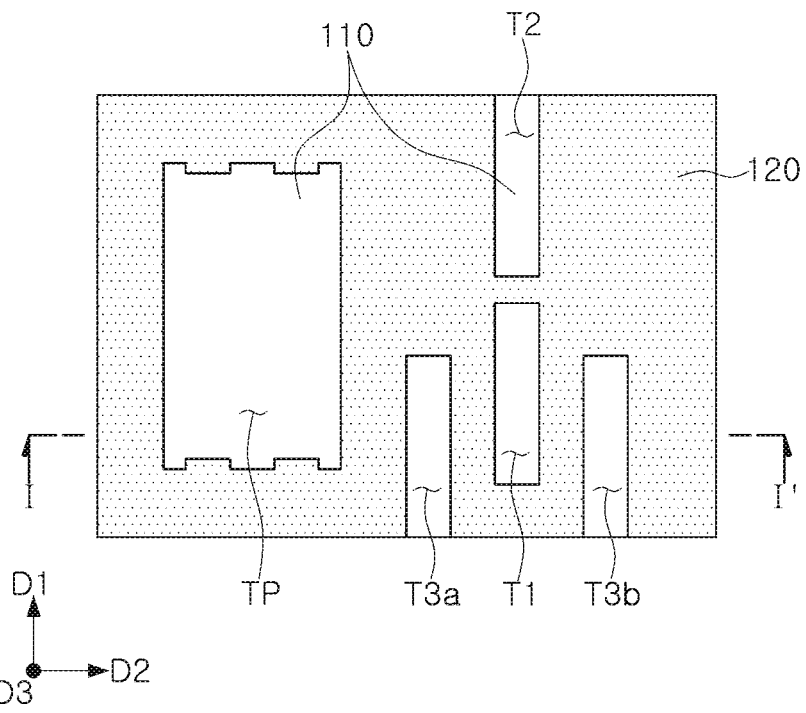
FIGS. 17A and 17B and FIGS. 18 to 20 are plan views or cross-sectional views illustrating some processes (interconnection line formation) in a method of fabricating a semiconductor device according to various example embodiments.
Figure 17B:
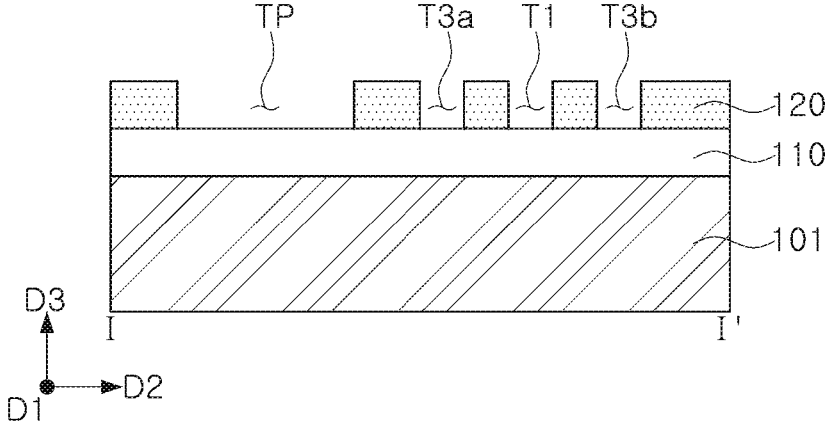

First, referring to FIGS. 17A and 17B, the dielectric layer 120 may be patterned using the first hard mask layer 131. In the dielectric layer 120, first to third trenches T1, T2, T3a, and T3b, and a wide trench TP, respectively corresponding to the first to third linear openings L1, L2, L3a, and L3b, and the wide opening LP, may be formed. When an etch-stop layer (not illustrated) is introduced between the dielectric layer 120 and the interlayer insulating layer 110, a portion of the etch-stop layer exposed on bottom surfaces of the first to third trenches T1, T2, T3a, and T3b and the wide trench TP may also be removed. The first to third trenches T1, T2, T3a, and T3b and the wide trench TP may define interconnection lines to be formed in a subsequent process.

Figure 18:
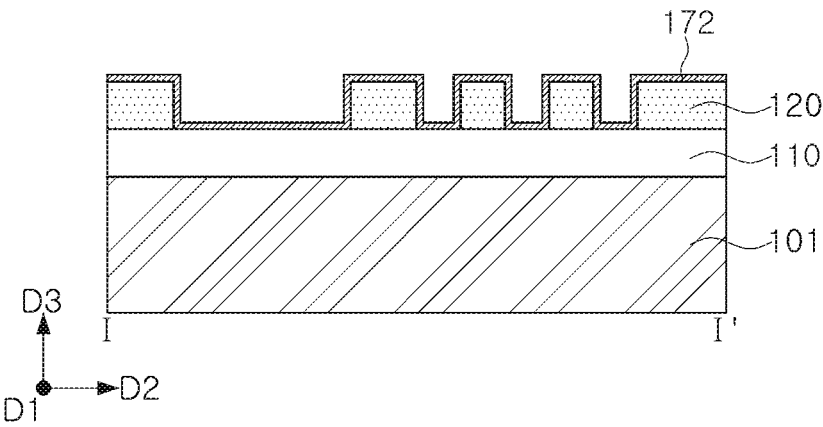

Next, referring to FIG. 18, a conductive barrier 172 may be formed on the dielectric layer 120 in which the first to third trenches T1, T2, T3a, and T3b and the wide trench TP are formed. The conductive barrier 172 may be employed to prevent or reduce diffusion of an element of a metal layer to be formed in a subsequent process. For example, the conductive barrier 172 may include a conductive nitride such as one or more of TiN, TaN, AlN, or WN.

Figure 19:
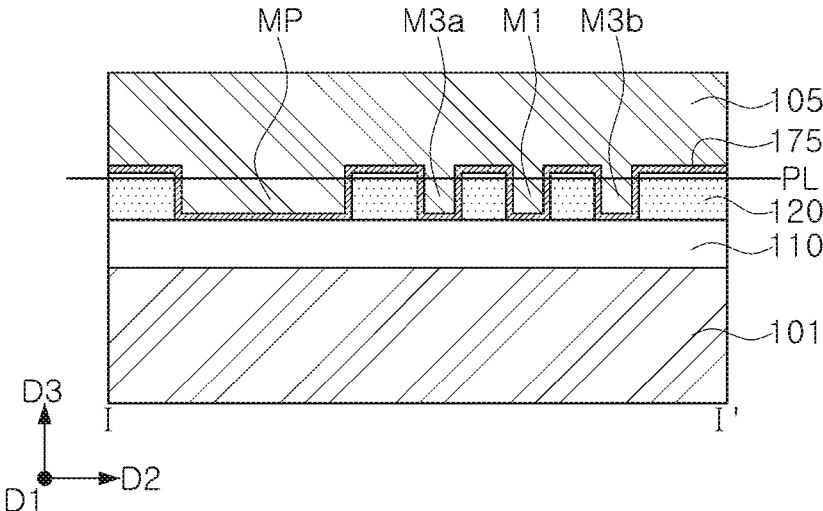

Next, referring to FIG. 19, a metal layer 175 may be formed on the conductive barrier 172, to fill the first to third trenches T1, T2, T3a, and T3b and the wide trench TP. The metal layer 175 may be or may include, for example, one or more of gold (Au), titanium (Ti), copper (Cu), silver (Ag), aluminum (Al), tungsten (W), cobalt (Co), chromium (Cr), molybdenum (Mo), zirconium (Zr), nickel (Ni), tantalum (Ta), platinum (Pt), or alloys thereof. The metal layer may be formed by, for example, a deposition process such as one or more of a physical vapor deposition (PVD) and chemical vapor deposition (CVD), and a plating process such as electroplating and electroless plating.

Next, a planarization process of the metal layer 175 may be performed. The planarization process of the metal layer 175 may be performed until an upper surface of the dielectric layer 120 is exposed ("PL" line). This planarization process may be performed by, for example, a chemical mechanical polishing (CMP) process and/or an etch-back process.

Figure 20:
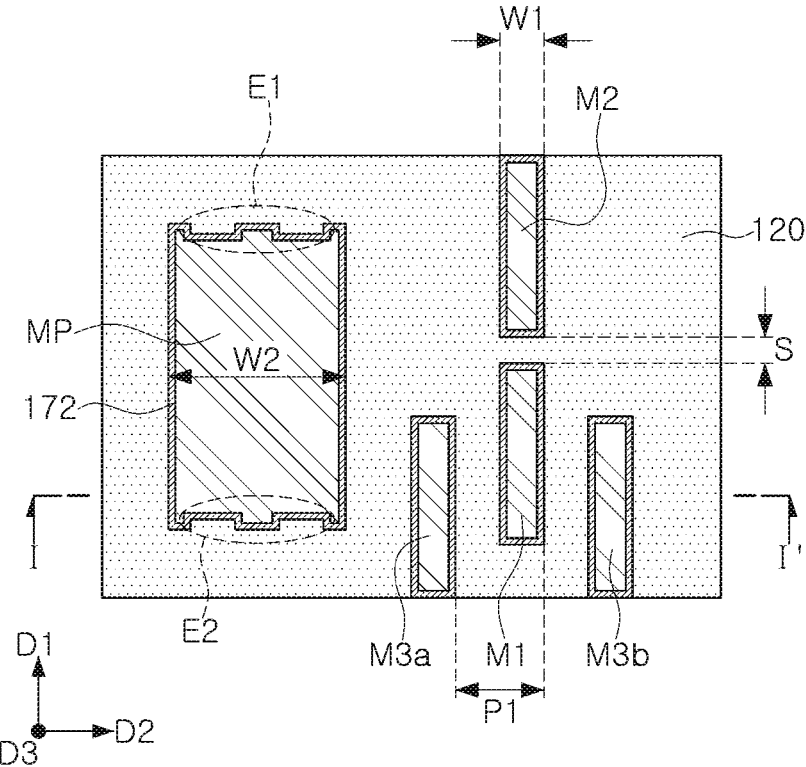

Therefore, as illustrated in FIG. 20, first to third interconnection lines M1, M2, M3*a*, and M3*b*, and a wide pattern MP may be formed on the dielectric layer 120. The first to third interconnection lines M1, M2, M3*a*, and M3*b* may be patterns having a design width or a minimum width W1 defined by a linear space LS of the spacers 150, and the wide pattern MP may be a pattern having a width W2, greater than the width W1 of each of the other interconnection lines.

In the wide pattern MP, sides E1 and E2 facing in the first direction D1 may have curved portions. Each of the curved sides E1 and E2 may have a corresponding protruding portion below protruding spacer portions (150P in FIG. 13A).

In various example embodiments, the first interconnection line M1 may be disposed adjacent to the second interconnection line M2 in the first direction, and the first and second interconnection lines M1 and M2 having a narrow interval S in the first direction may be reliably implemented using a photolithography process using the spacers 150. The interval S of each of the first and second interconnection lines M1 and M2 in the first direction may be 20 nm or less.

Some example embodiments may be implemented to be different from and/or more complex than the interconnection lines illustrated in FIG. 20. In some example embodiments, an example in which the additional linear openings L3*a* and L3*b* are introduced in the second photolithography process is illustrated, but may be implemented by being replaced with another photolithography process, for example, the first photolithography process, and/or may be implemented separately in the first and second photolithography processes. Alternatively or additionally, although a process of forming the wide opening LP is illustrated as a process of etching the spacer portion 150E' together through a separate photolithography process (e.g., a third photolithography process), a process of forming the mandrel line 140L may be replaced by a process of forming a wide mandrel pattern.

In the etching process using the third photomask, sides opposing in the first direction D1 may have different profiles due to a difference in etch rates between the material of the spacer 150 and the material of the second hard mask layer 132.

Figure 21A:
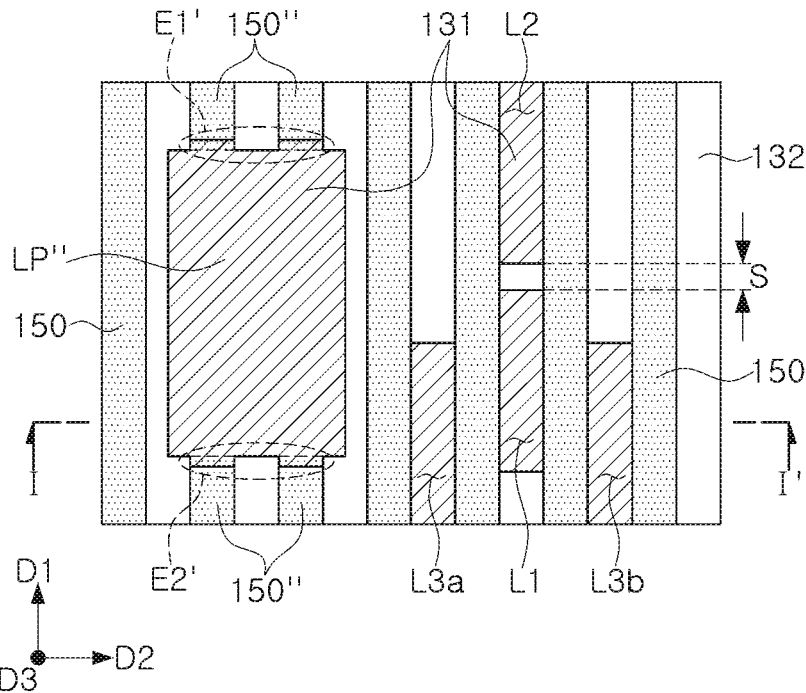
FIGS. 21A and 21B are plan views illustrating some processes in a method of fabricating a semiconductor device according to various example embodiments.
Figure 21B:
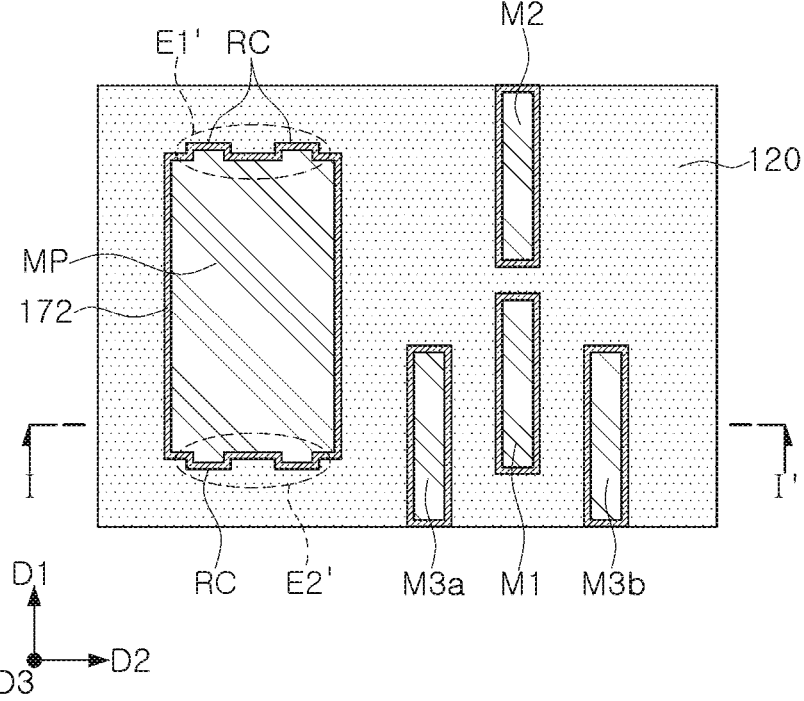

FIGS. 21A and 21B are plan views illustrating some processes of a method of fabricating a semiconductor device according to various example embodiments. Processes of FIGS. 21A and 21B are understood to correspond to the processes of FIGS. 14A and 20, respectively.

Referring to FIG. 21A, a wide opening LP" may be formed on a second hard mask layer 132 using a third opening of a third photomask 190C.

In this process, unlike the previous first and second photolithography etching processes, the second hard mask layer 132 may be formed, together with spacer portions exposed by the third opening, using the third photomask 190C. The wide opening LP" may be formed in the second hard mask layer 132 by etching.

When a material of a spacer 150 has an etch rate, higher than or faster than an etch rate of a material of the second hard mask layer 132 in the present etching process, as illustrated in FIG. 21A, the spacer portions 150" on opposite sides E1' and E2' of the wide opening LP" may be over-etched, and a portion of the second hard mask layer 132 may be additionally etched as much as the over-etched and exposed region. The opposite sides E1' and E2' of the opening LP" may have curved portions having a profile, different from those of the sides E1 and E2 in various other example embodiments.

FIG. 21B illustrates interconnection lines formed as a result of performing processes corresponding to FIG. 19 from FIGS. 15A to 15B.

Referring to FIG. 21B, first to third interconnection lines M1, M2, M3*a* and M3*b* and a wide pattern MP may be formed in a dielectric layer 120, and the wide pattern MP may have a shape corresponding to a wide opening LP". For example, in the wide pattern MP, sides E1' and E2' opposing in the first direction D1 may have curved portions. The curved sides E1' and E2' may have a corresponding recessed portion RC, respectively, below the recessed spacer portions 150" in FIG. 21A.

Unlike some other example embodiments, in the third photolithography etching process, when the material of the spacer 150 and the material of the second hard mask layer 132 have similar etch rates, opposite both sides of the wide pattern MP in the first direction D1 may have a substantially straight line shape.

In other example embodiments, an example in which a process for forming a wide opening is performed as a process of removing the spacer portions and the second hard mask layer together through the wide opening by introducing a third photolithography process is illustrated (please refer to FIGS. 12A, 13A, and 14A, and FIGS. 12B, 13B, and 14B), but may be replaced with a method of forming a wide mandrel pattern corresponding to the wide pattern in a process of forming a mandrel line.

FIGS. 22A, 23A, 24A, 25A, and 26A are plan views illustrating some processes of a method of fabricating a semiconductor device according to various example embodiments, and FIGS. 22B, 23B, 24B, 25B, and 26B are cross-sectional views of the planes of FIGS. 22A, 23A, 24A, 25A, and 26A, respectively, taken along line I-I'.

Figure 22A:
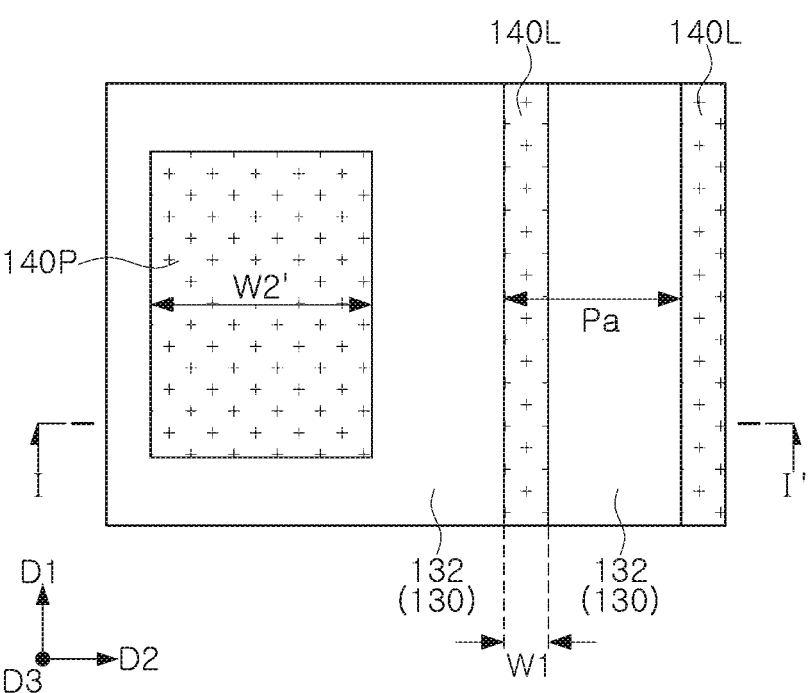
FIGS. 22A, 23A, 24A, 25A, and 26A are plan views illustrating some processes in a method of fabricating a semiconductor device according to various example embodiments.
Figure 22B:
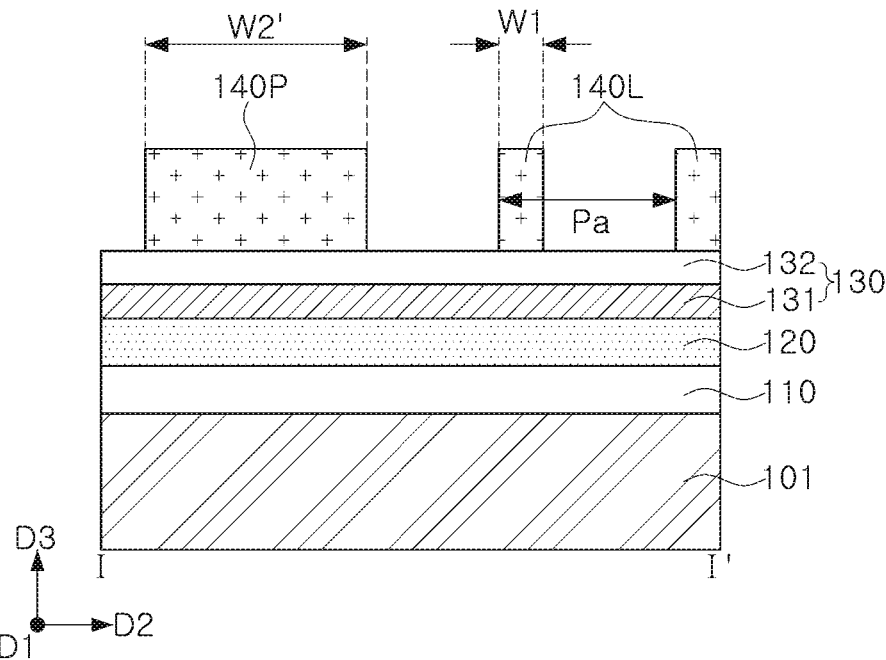
FIGS. 22B, 23B, 24B, 25B, and 26B are cross-sectional views of the planes of FIGS. 22A, 23A, 24A, 25A, and 26A, respectively, taken along line I-I'.

First, referring to FIGS. 22A and 22B, a plurality of mandrel lines 140L and at least one mandrel pattern 140P may be formed on a hard mask layer 130.

The plurality of mandrel lines 140L and the at least one mandrel pattern 140P may be obtained by a photolithography process, as described with reference to FIGS. 2A and 2B. The plurality of mandrel lines 140L may extend in the first direction D1, respectively, and may be arranged at a first pitch Pa in the second direction D2. The mandrel pattern 140P has an area corresponding to a final wide pattern to be formed in a subsequent interconnection line forming process. The mandrel pattern 140P may have a width W2', greater than a width W1 of each of the plurality of mandrel lines 140L.

Figure 23A:
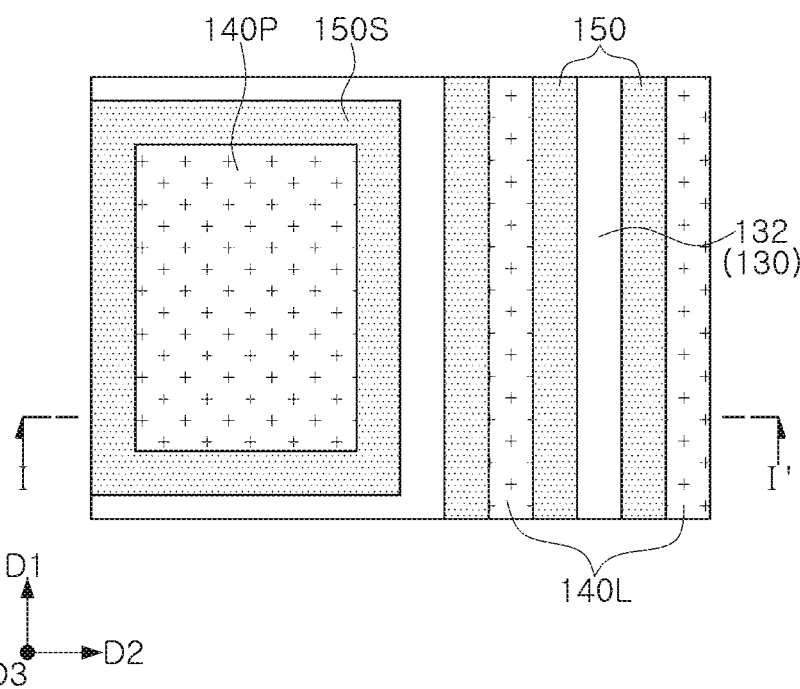
Figure 23B:
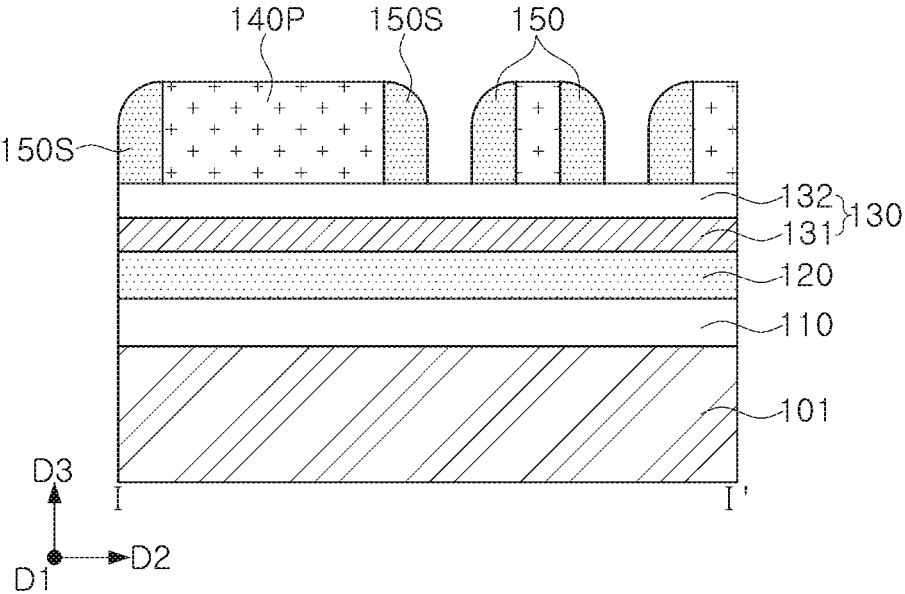

Next, referring to FIGS. 23A and 23B, first spacers 150 may be formed on both sidewalls of each of the plurality of mandrel lines 140L, and a second spacer 150S may be formed on sidewalls of the mandrel pattern 140P to surround the mandrel pattern 140P.

This process may be obtained by forming a spacer material layer 150' and performing an etching back process, as described with reference to FIGS. 4A and 4B. The first spacer 150 may have a pattern extending in the first direction D1, and the second spacer 150S may be formed to surround the mandrel pattern 140P.

Figure 24A:
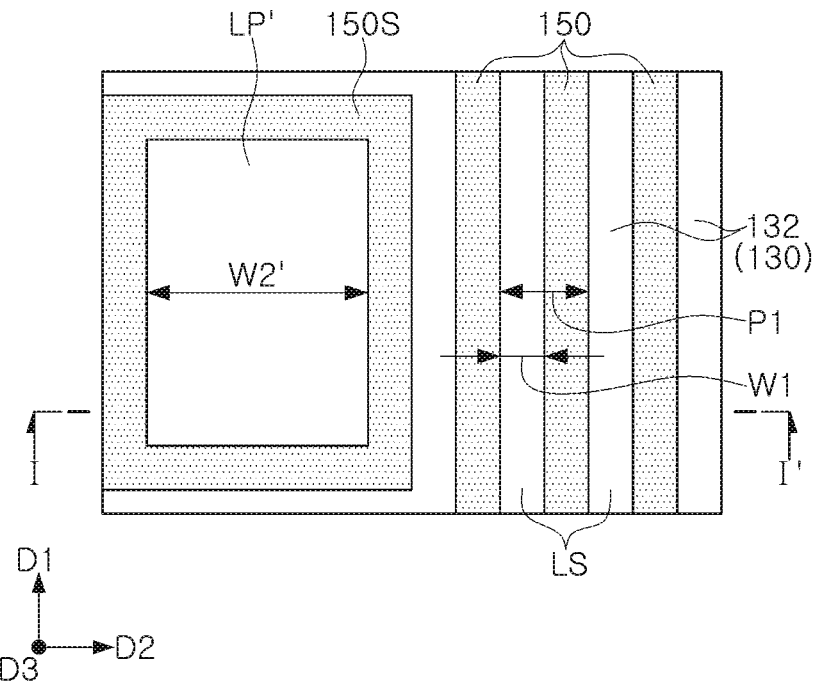
Figure 24B:
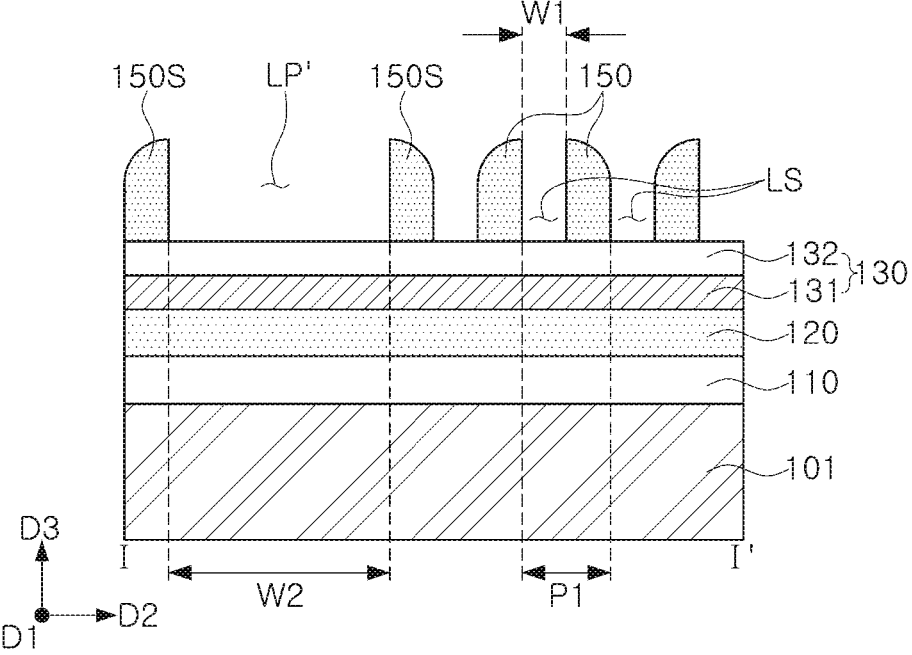

Next, referring to FIGS. 24A and 24B, the plurality of mandrel lines 140L and the mandrel pattern 140P may be removed from the first spacers 150 and the second spacer 150S.

This process may be performed in a manner similar to FIGS. 5A and 5B. A linear space LS between the first spacers 150 may define a target pattern having a minimum, or design, width W1. These linear spaces LS may be arranged at a constant pitch P1. Also, a wide space LP' of the second spacer 150S may define a wide pattern area. A width W2' of the second spacer 150S in the second direction D2 may be greater than the width W1 of each of the linear spaces LS.

Figure 25A:
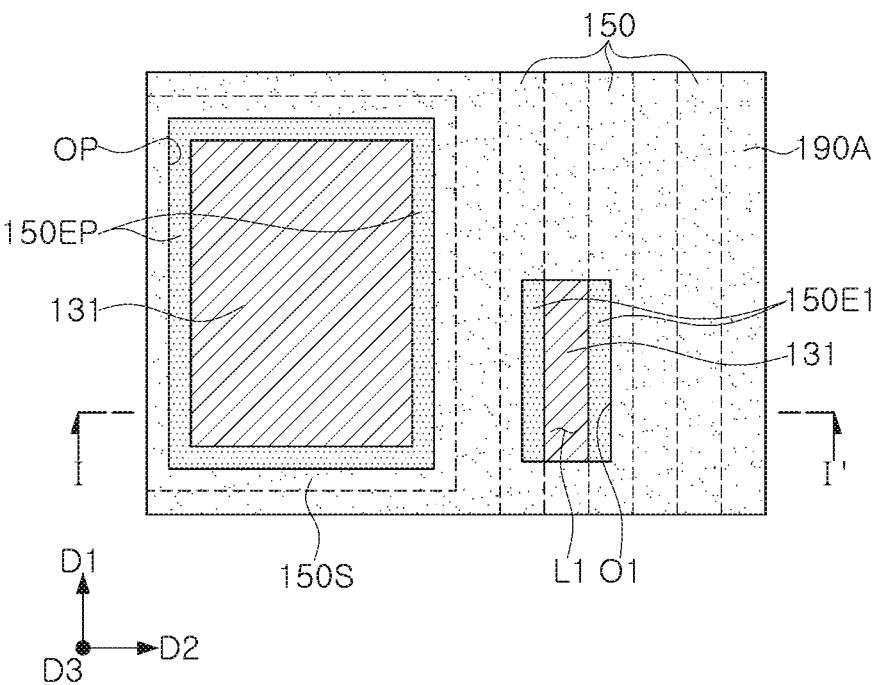
Figure 25B:
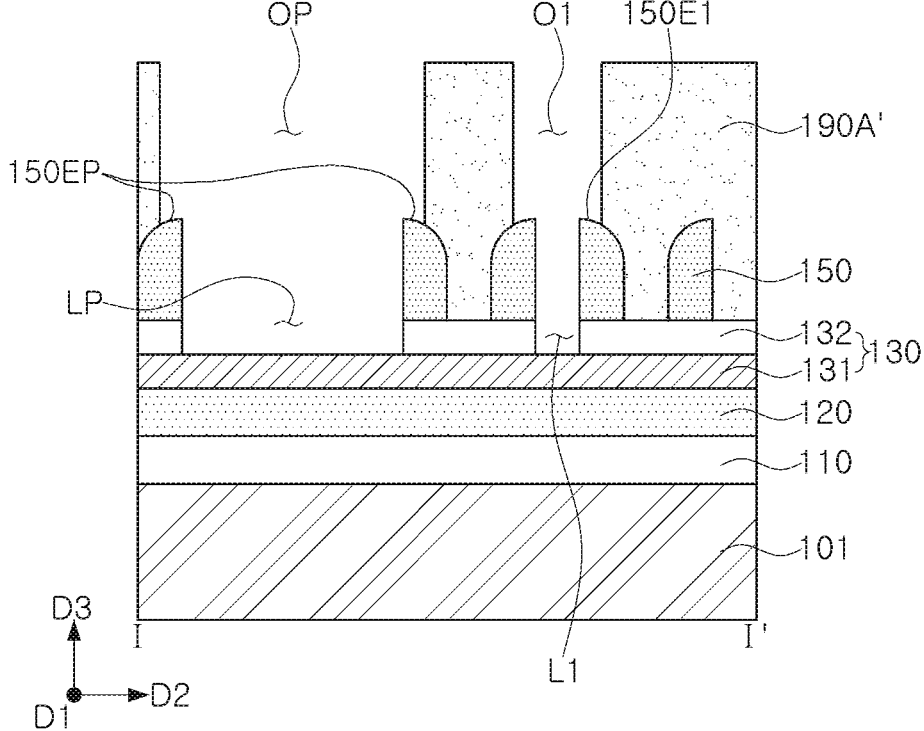

Next, referring to FIGS. 25A and 25B, a first linear opening L1 and a wide opening LP may be formed in the second hard mask layer 132 using the first photomask 190A'.

A photoresist layer may be formed on the hard mask layer 130 on which the first and second spacers 150 and 150S are formed, and the first opening O1 may be formed from the first photoresist layer using a first photolithography process. A first photomask 190A' having an opening OP for a pattern may be formed. In this case, the first opening O1 may expose a first linear space defined as a first region of a space between adjacent first spacers, among the spacers 150, and the opening OP for a pattern may expose a space for a pattern surrounded by the second spacer 150S. The opening OP for a pattern may expose a region 150EP of the second spacer 150S.

Next, the second hard mask layer 132 may be etched using the first photomask 190A', to form the first linear opening L1 corresponding to the first linear space in the second hard mask layer 132, and the wide opening LP corresponding to the space for a pattern.

The first linear opening L1 may be defined by the first opening O1 of the first photomask 190A' in the first direction D1, and may be defined by an exposed region 150E1 of the adjacent spacers in the second direction D2. Unlike the process of forming the wide opening in the previous embodiment (please refer to FIGS. 13A and 13B), in some example embodiments, the wide opening LP allows the exposed region 150EP of the second spacer 150S to act as a mask. For example, the wide opening LP may be defined by a region surrounded by the exposed region 150EP of the second spacer 150S.

Figure 26A:
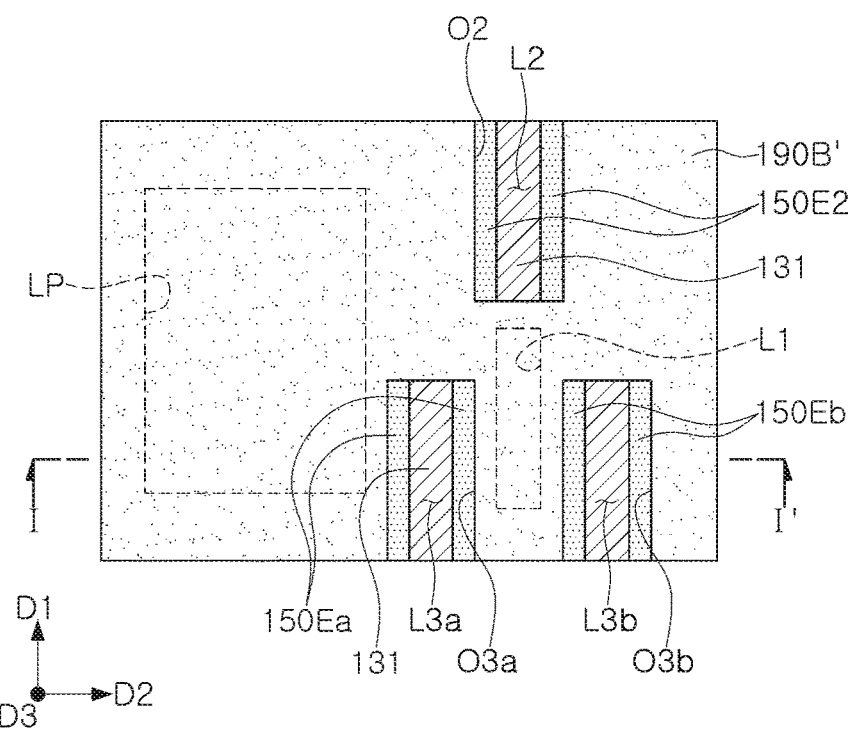
Figure 26B:
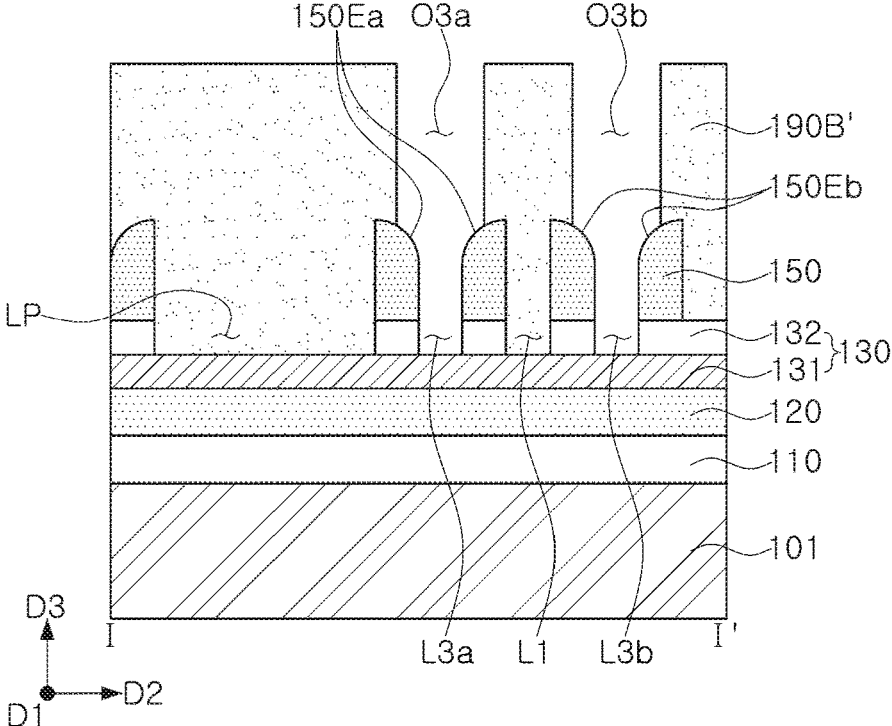

Next, referring to FIGS. 26A and 26B, after removing the first photomask 190A', a second linear opening L2 and additional linear openings L3a and L3b may be formed in the second hard mask layer 132 using a second photomask 190B'.

The second photomask 190B' having a second opening O2 may be formed on the second hard mask layer 132. In some example embodiments, the second photomask 190B' may further include at least one additional opening (e.g., O3a and O3b) for opening an additional third linear space. The additional openings O3a and O3b may have a width, identical to a width of the second opening O2.

A second photoresist layer may be formed on the second hard mask layer 132 on which the spacers 150 are formed, and the second photomask 190B' having the second opening O2 and the additional openings O3a and O3b may be formed from the second photoresist layer using a second photolithography process. In this case, the second opening O2 may be formed to expose a second linear space defined as a second region of a space between adjacent first spacers 150, among the spacers 150. The additional openings O3a and O3b may be formed to expose an additional third linear space defined as at least a partial region of a space between other adjacent first spacers 150. In the second linear space, an interval between the second linear space and the first linear opening L1 in the first direction D1 may be adjusted to a minute interval S. For example, the interval S may be 20 nm or less.

A region 150E2 of the adjacent first spacers may be exposed by the second opening O2. Similarly, regions 150Ea and 150Eb of the different adjacent first spacers may be exposed by the additional openings O3a and O3b.

A second linear opening L2 and additional linear openings L3a and L3b may be formed in the second hard mask layer 132 using the second photomask 190B'. The second linear opening L2 may be defined by the second opening O2 of the second photomask 190B' in the first direction D1, and may be defined by the exposed region 150E2 of adjacent first spacers in the second direction D2. Similarly, the third linear openings L3a and L3b may be respectively defined by the additional openings O3a and O3b of the second photomask 190B' in the first direction D1, and may be respectively defined by the exposed regions 150Ea and 150Eb of the adjacent first spacers in the second direction D2.

In various example embodiments, the additional third linear openings L3a and L3b may not be formed in the second photomask 190B', but may be formed only in the first photomask 190A', or may be separately formed in the first and second photomasks 190A' and 190B', respectively.

Next, after removing the second photomask 190B' (please refer to FIGS. 15A and 15B), patterns of the openings L1, L2, L3a, L3b, and LP in the second hard mask layer 132 may be transferred to the first hard mask layer 131 (please refer to FIGS. 16A and 16B), a process of forming an interconnection line may be performed using the transferred (or patterned) first hard mask layer 131 (FIGS. 17A and 17B and FIGS. 18 to 20).

In some example embodiments, a process of forming the wide opening LP corresponding to a space surrounded by the second spacers 150S in the second hard mask layer 132 is illustrated as being performed together with a process of forming the first linear opening L1 using the first photomask 190A', but may also be performed together with a process of forming the second linear opening L2 using the second photomask 190B'.

As described above, according to various example embodiments, interconnection lines (or metal lines) arranged at minute intervals may be more effectively formed using photolithography etching, together with spacers formed using mandrel lines. In particular, openings for interconnection lines of which end portions are very adjacent to have 20 nm or less may be formed using the spacers by another photolithography etching process.

Various advantages and effects of inventive concepts are not limited to the above, and will be more easily understood in the process of describing specific example embodiments.

While some example embodiments have been illustrated and described above, it will be apparent to those of ordinary skill in the art that modifications and variations could be made without departing from the scope of inventive concepts as defined by the appended claims. Furthermore example embodiments are not necessarily mutually exclusive with one another. For example, some example embodiments may include one or more features described with reference to one or more figures, and may also include one or more other features described with reference to one or more other figures.

What is claimed is:

1. A method of fabricating a semiconductor device, comprising:

forming a hard mask layer on a target layer;

forming a plurality of mandrel lines on the hard mask layer, wherein the plurality of mandrel lines extend in a first direction and are arranged in a second direction that intersects the first direction;

forming spacers on sidewalls of each of the plurality of mandrel lines;

removing the plurality of mandrel lines from the spacers, wherein the spacers are arranged at intervals defined by a design width of a target pattern;

forming a first photomask having a first opening on the hard mask layer on which the spacers are formed, wherein the first opening exposes a first linear space defined as a first region of a first space between adjacent ones of the spacers;

forming a first linear opening corresponding to the first linear space in the hard mask layer by etching the hard mask layer using the first photomask;

forming a second photomask having a second opening on the hard mask layer on which the spacers are formed, after removing the first photomask, wherein the second opening exposes a second linear space defined as a second region of the first space between the adjacent ones of the spacers;

forming a second linear opening corresponding to the second linear space in the hard mask layer by etching the hard mask layer using the second photomask; and etching the target layer using the hard mask layer, after removing the second photomask, wherein at least one of the first opening and the second opening exposes portions of the adjacent spacers, and the exposed portions of the adjacent spacers function as a mask in the forming the first linear opening and the second linear opening.

2. The method of claim 1, wherein a distance between first linear space and the second linear space in the first direction is 20 nm or less.

3. The method of claim 1, wherein at least one of the first photomask and the second photomask has at least one additional opening for exposing an additional linear space, and the forming the first linear opening and/or the second linear opening includes forming at least one additional linear opening through the at least one additional opening in the hard mask layer.

4. The method of claim 3, wherein the at least one additional linear space is defined by at least one region of a space between adjacent ones of the spacers.

5. The method of claim 3, wherein the at least one additional linear space is defined by a third region of a second space between other adjacent ones of the spacers.

6. The method of claim 1, further comprising:

forming a third photomask having a third opening on the hard mask layer on which the spacers are formed, wherein the third opening has a width greater than a width of each of the first and second linear openings in the second direction, and exposes at least one spacer of the spacers;

removing an exposed portion of the at least one spacer using the third photomask; and etching the hard mask layer using the third photomask, to form a wide opening having a width greater than the design width, in the hard mask layer.

7. The method of claim 6, wherein the removing the exposed portion of the at least one spacer and the etching the hard mask layer are performed by a same etching process.

8. The method of claim 6, wherein sides of the wide opening opposing in the first direction are curved.

9. The method of claim 6, wherein the wide opening has a width extending over the at least one spacer and two spaces adjacent thereto in the second direction.

10. The method of claim 1, wherein the forming the plurality of mandrel lines comprises forming a mandrel pattern having a second width greater than a first width of each of the plurality of mandrel lines, the forming the spacers on both sidewalls of each of the plurality of mandrel lines comprises forming a perimeter spacer along sidewalls of the mandrel pattern to surround the mandrel pattern, and the removing the plurality of mandrel lines comprises removing the mandrel pattern from the perimeter spacer.

11. The method of claim 10, further comprising:

forming a third photomask having a third opening on the hard mask layer in which the spacers are formed, wherein the third opening exposes a portion of the hard mask layer surrounded by the perimeter spacer; and etching the hard mask layer using the third photomask, to form a wide opening having the second width in the hard mask layer.

12. The method of claim 10, wherein one of the first photomask or the second photomask comprises a third opening exposing a portion of the hard mask layer surrounded by the perimeter spacer, and either or both of the forming the first linear opening or the forming the second linear opening comprises forming a wide opening having the second width in the hard mask layer.

13. The method of claim 1, wherein the forming the spacers comprises:

conformally forming a spacer material layer on the plurality of mandrel lines and the hard mask layer, and performing anisotropic etching on the spacer material layer.

14. The method of claim 1, wherein the forming a second photomask includes forming the second photomask on the spacers.

15. The method of claim 1, wherein the forming a second photomask includes forming the second photomask before removing the spacers.

16. A method of fabricating a semiconductor device, comprising:

forming a dielectric layer on a substrate;

forming a hard mask layer on the dielectric layer;

forming a plurality of mandrel lines on the hard mask layer, wherein the plurality of mandrel lines extend in a first direction, and are arranged in a second direction, intersecting the first direction;

forming spacers on both sidewalls of each of the plurality of mandrel lines;

removing the plurality of mandrel lines from the spacers, wherein the spacers are arranged at intervals defined by a design width of a target pattern;

forming a first linear opening corresponding to a first region of a space between adjacent ones of the spacers in the hard mask layer using a first photomask;

forming a second linear opening corresponding to a second region of the space between the adjacent ones of the spacers in the hard mask layer using a second photomask, wherein the second linear opening is adjacent to the first linear opening in the first direction;

forming first and second trenches respectively corresponding to the first and second linear openings in the dielectric layer using the hard mask layer;

forming a plurality of interconnection lines by filling the first and second trenches with a conductive material; and forming a wide opening having a width greater than a width of each of the first and second linear openings, in the hard mask layer using a third photomask, wherein the wide opening is configured to expose at least one spacer of the spacers, wherein the forming the wide opening includes removing an exposed region of the at least one spacer using the third photomask.

17. The method of claim 16, wherein each of sides of the wide opening opposing in the first direction has non-straight line.

18. The method of claim 16, wherein the forming the first linear opening and/or the forming the second linear opening comprises forming at least one additional linear opening in the hard mask layer.

19. A method of fabricating a semiconductor device, comprising:

forming a dielectric layer on a substrate;

forming a hard mask layer on the dielectric layer;

forming a plurality of mandrel lines and at least one mandrel pattern on the hard mask layer, wherein each of the plurality of mandrel lines extend in a first direction, respectively, and the plurality of mandrel lines are arranged in a second direction, intersecting the first direction, wherein the at least one mandrel pattern has a width, greater than a width of each of the plurality of mandrel lines;

forming first spacers and a second spacer on both sidewalls of each of the plurality of mandrel lines and sidewalls surrounding the at least one mandrel pattern, respectively;

removing the plurality of mandrel lines and the at least one mandrel pattern from the first spacers and the second spacer, wherein a distance between the first spacers defines a design width of a target pattern;

forming a first linear opening corresponding to a first region of a first space between adjacent ones of the first spacers in the hard mask layer using a first photomask;

forming a second linear opening corresponding to a second region of the first space between the adjacent ones of the first spacers in the hard mask layer using a second photomask, wherein the second linear opening is adjacent to the first linear opening in the first direction;

forming a wide opening corresponding to a second space surrounded by the second spacer in the hard mask layer;

forming first and second trenches respectively corresponding to the first and second linear openings and the wide opening in the dielectric layer using the hard mask layer; and forming a plurality of interconnection lines by filling the first and second trenches with a conductive material.

20. The method of claim 19, wherein the forming the wide opening is performed simultaneously with the forming the first linear opening or the forming the second linear opening.

* * * * *